United States Patent
Nakabayashi et al.

(10) Patent No.: US 11,594,665 B2
(45) Date of Patent: Feb. 28, 2023

(54) LIGHT-EMITTING UNIT AND SURFACE-EMISSION LIGHT SOURCE

(71) Applicant: NICHIA CORPORATION, Anan (JP)

(72) Inventors: Takuya Nakabayashi, Tokushima (JP); Toshinobu Katsumata, Anan (JP); Noriaki Hiraide, Suwa-gun (JP)

(73) Assignee: Nichia Corporation, Anan (JP)

( * ) Notice: Subject to any disclaimer, the term of this patent is extended or adjusted under 35 U.S.C. 154(b) by 98 days.

(21) Appl. No.: 16/945,046

(22) Filed: Jul. 31, 2020

(65) Prior Publication Data

US 2021/0036198 A1 Feb. 4, 2021

(30) Foreign Application Priority Data

Aug. 2, 2019 (JP) .............................. JP2019-143127
Feb. 6, 2020 (JP) .............................. JP2020-019135
(Continued)

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/10* (2013.01); *H01L 33/486* (2013.01);
(Continued)

(58) Field of Classification Search
CPC ............. H01L 2933/0083; H01L 33/46; H01L 25/0753; H01L 33/62; H01L 27/156;
(Continued)

(56) References Cited

U.S. PATENT DOCUMENTS

2004/0218390 A1* 11/2004 Holman ............... G02B 17/002
362/245
2007/0096131 A1* 5/2007 Chandra ............... H01L 33/505
257/99
(Continued)

FOREIGN PATENT DOCUMENTS

JP 2002-335020 A 11/2002
JP 2010-238846 A 10/2010
(Continued)

OTHER PUBLICATIONS

US 2014/0070249-A1 corresponds to JP 2014-057062-A.
(Continued)

*Primary Examiner* — Feifei Yeung Lopez
(74) *Attorney, Agent, or Firm* — Birch, Stewart, Kolasch & Birch, LLP

(57) ABSTRACT

A light-emitting unit includes: a wiring board; light-emitting elements on the wiring board; a light reflecting member on the wiring board, the light reflecting member covering a lateral surface of each of the light-emitting elements; wavelength conversion layers each provided on or above an emission surface of a corresponding one of the plurality of light-emitting elements; light reflecting layers on the wavelength conversion layers, respectively; and a protecting layer configured to transmit light and provided on the light reflecting member. The light-transmitting protecting layer covers at least a lateral surface of the wavelength conversion layers and at least a lateral surfaces of the light reflecting layers. An upper surface of the protecting layer has a first recess in a region where the plurality of light reflecting layers are not present in a top view. The first recess includes at least one concave surface.

19 Claims, 25 Drawing Sheets

(30) Foreign Application Priority Data

Apr. 20, 2020 (JP) .............................. JP2020-074798
Jul. 27, 2020 (JP) .............................. JP2020-126638

(51) Int. Cl.

| | |
|---|---|
| H01L 33/10 | (2010.01) |
| H01L 33/60 | (2010.01) |
| H01L 33/48 | (2010.01) |
| H01L 33/50 | (2010.01) |
| H05K 1/18 | (2006.01) |

(52) U.S. Cl.

CPC .............. *H01L 33/50* (2013.01); *H01L 33/60* (2013.01); *H05K 1/189* (2013.01); *H01L 2933/0083* (2013.01)

(58) Field of Classification Search

CPC ....... H01L 33/10; H01L 33/486; H01L 33/50; H01L 33/60; H05K 1/189

See application file for complete search history.

(56) References Cited

U.S. PATENT DOCUMENTS

| | | | | |
|---|---|---|---|---|
| 2008/0210966 A1* | 9/2008 | Sakamoto | ............... | H01L 33/46 257/98 |
| 2011/0050735 A1* | 3/2011 | Bae | .................. | G02F 1/133605 345/690 |
| 2011/0051043 A1* | 3/2011 | Kim | .................. | G02F 1/133308 349/64 |
| 2011/0175117 A1* | 7/2011 | Jagt | .......................... | H01L 33/44 257/88 |
| 2014/0070235 A1* | 3/2014 | Andrews | ................. | H01L 33/62 257/88 |
| 2014/0070249 A1 | 3/2014 | Yoon et al. | | |
| 2014/0071689 A1 | 3/2014 | Yoon et al. | | |
| 2015/0102366 A1 | 4/2015 | Wada | | |
| 2017/0154880 A1 | 6/2017 | Ozeki et al. | | |
| 2020/0350295 A1* | 11/2020 | Hu | .......................... | H01L 33/60 |
| 2021/0265328 A1* | 8/2021 | Lee | .......................... | F21K 9/60 |

FOREIGN PATENT DOCUMENTS

| | | |
|---|---|---|
| JP | 2012-243822 A | 12/2012 |
| JP | 2013-175759 A | 9/2013 |
| JP | 2014-057061 A | 3/2014 |
| JP | 2014-057062 A | 3/2014 |
| JP | 2015-079805 A | 4/2015 |
| JP | 2017-108092 A | 6/2017 |

OTHER PUBLICATIONS

US 2017/0154880-A1 corresponds to JP 2017-108092-A.
US 2014/0071689-A1 corresponds to JP 2014-057061-A.
US 2015/0102366-A1 corresponds to JP 2015-079805-A.

* cited by examiner

LIGHT-EMITTING UNIT AND SURFACE-EMISSION LIGHT SOURCE

CROSS REFERENCE TO RELATED APPLICATIONS

This application claims priority to Japanese Patent Application No. 2019-143127, filed on Aug. 2, 2019, Japanese Patent Application No. 2020-019135, filed on Feb. 6, 2020, Japanese Patent Application No. 2020-074798, filed on Apr. 20, 2020, and Japanese Patent Application No. 2020-126638, filed on Jul. 27, 2020, the disclosures of which are hereby incorporated by reference in their entireties.

BACKGROUND

The present disclosure relates to a light-emitting unit and a surface-emission light source.

Japanese Patent Publication No. 2013-175759 and Japanese Patent Publication No. 2002-335020 disclose light-emitting units which have a configuration where lateral surfaces of light-emitting elements are covered with a light reflecting member. By covering the lateral surfaces of the light-emitting elements with the light reflecting member, leakage of light from the lateral surfaces of the light-emitting elements can be suppressed and, as a result, the luminance can be improved.

SUMMARY

As a direct-lit backlight for display devices such as liquid crystal display devices, a light-emitting unit has been proposed in which a plurality of light-emitting elements are two-dimensionally arrayed. Such a light-emitting unit is required to have improved light extraction efficiency, further-reduced thickness, etc.

According to the embodiments of the present disclosure, a light-emitting unit of the present disclosure includes: a wiring board; a plurality of light-emitting elements provided on the wiring board and electrically connected with a wire layer of the wiring board; a light reflecting member provided on the wiring board, the light reflecting member covering a lateral surface of each of the plurality of light-emitting elements; a plurality of wavelength conversion layers each provided on or above an emission surface of a corresponding one of the plurality of light-emitting elements; a plurality of light reflecting layers provided on the plurality of wavelength conversion layers, respectively; and a protecting layer configured to transmit light and provided on the light reflecting member, the protecting layer covering at least a lateral surface of the plurality of wavelength conversion layers and at least a lateral surface of the plurality of light reflecting layers. An upper surface of the protecting layer has a first recess in a region where the plurality of light reflecting layers are not present in a top view. The first recess includes at least one concave surface.

According to an exemplary embodiment of the present disclosure, a light-emitting unit is provided in which unevenness in luminance of light emitted from a light source is suppressed while the thickness and/or size can be reduced.

DETAILED DESCRIPTION

Embodiments of the present disclosure will now be described in detail with reference to the drawings. The following embodiments are illustrative, and the light-emitting unit of the present disclosure is not limited thereto. For example, the numerical values, shapes, materials, steps, and the order of steps, etc., to be shown in the following embodiments are merely examples, and various modifications can be made thereto so long as they do not lead to technical contradictions. The embodiments described below are merely illustrative, and various combinations are possible so long as they do not lead to technical contradictions.

The size, the shape, etc., of the components shown in the figures may be exaggerated for the ease of understanding, and they may not represent the size and the shape of the components, the size relationship therebetween in an actual light-emitting unit and an actual surface-emission light source. Some components may be omitted in order to prevent the figures from becoming excessively complicated.

In the following description, components of like functions may be denoted by like reference signs and may not be described redundantly. Terms indicating specific directions and positions (e.g., "upper", "lower", "right", "left", and other terms including such terms) may be used in the following description. Note however that these terms are used merely for the ease of understanding relative directions or positions in the figure being referred to. The arrangement of components in figures from documents other than the present disclosure, actual products, actual manufacturing apparatuses, etc., does not need to be equal to that shown in the figure being referred to, as long as it conforms with the directional or positional relationship as indicated by terms such as "upper" and "lower" in the figure being referred to. In the present disclosure, the term "parallel" encompasses cases where two straight lines, sides, planes, etc., are in the range of about 0±5°, unless otherwise specified. In the present disclosure, the term "perpendicular" or "orthogonal" encompasses cases where two straight lines, sides, planes, etc., are in the range of about 90±5°, unless otherwise specified.

1. Configuration of Light-Emitting Unit 200

Figure 1:
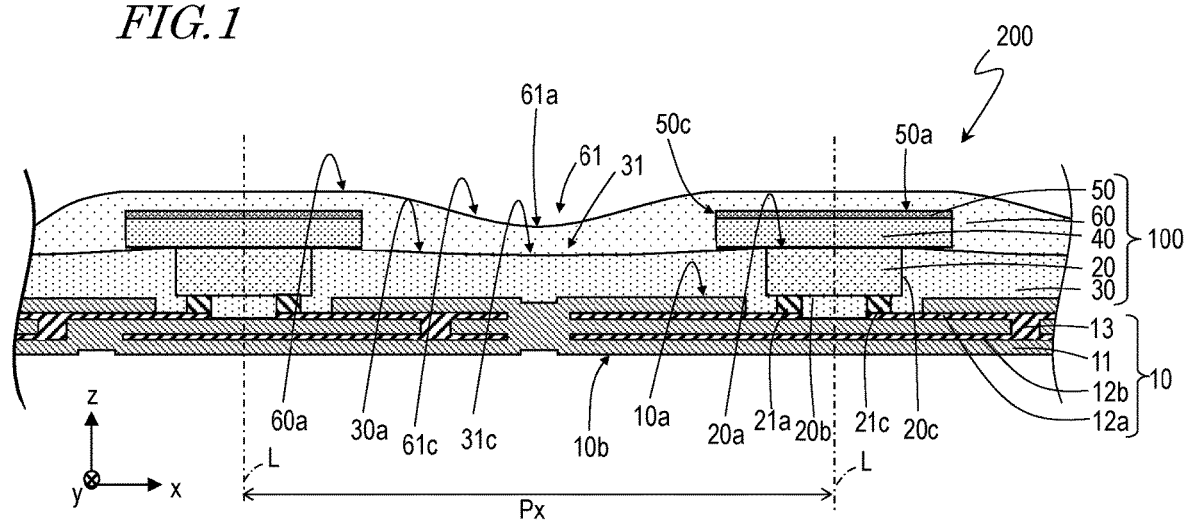
FIG. 1 is a cross-sectional view schematically showing an exemplary configuration of a light-emitting unit 200 of an embodiment of the present disclosure.
Figure 2:
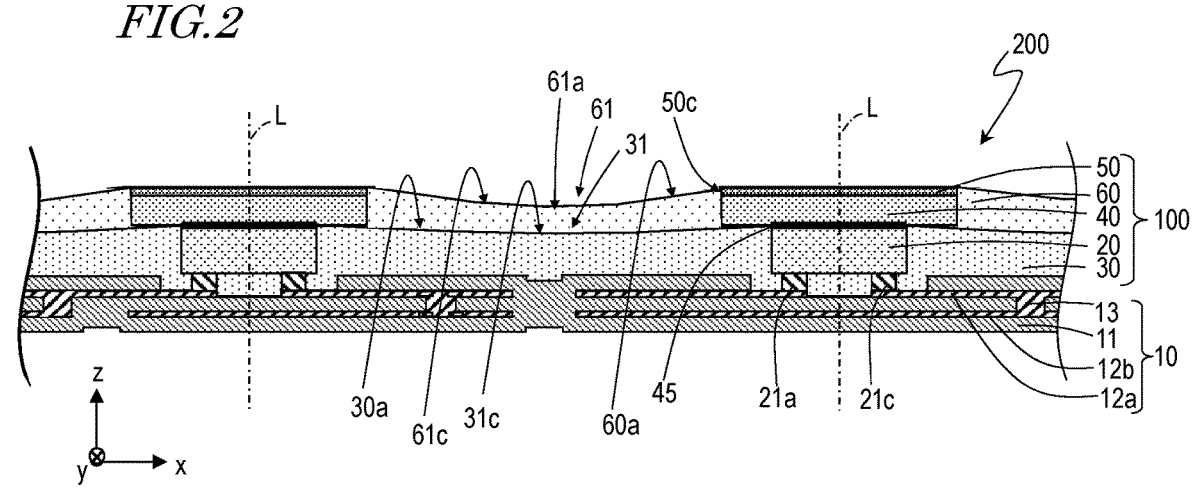
FIG. 2 is a cross-sectional view schematically showing another exemplary configuration of the light-emitting unit 200 shown in FIG. 1.
Figure 3:
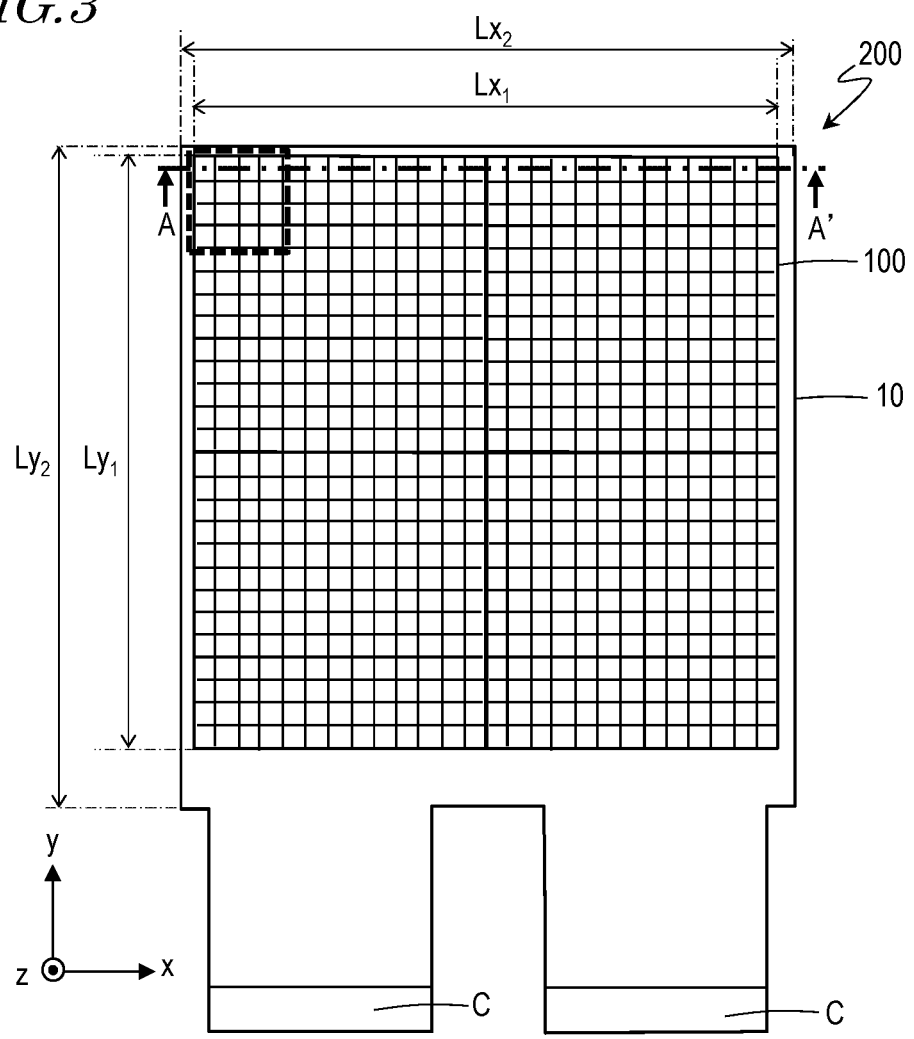
FIG. 3 is a schematic top view showing an exemplary external appearance of the light-emitting unit 200 of the present embodiment.

FIG. 1 is a cross-sectional view showing an exemplary configuration of a light-emitting unit 200 of an embodiment of the present disclosure. FIG. 2 is a cross-sectional view showing another exemplary configuration of the light-emitting unit 200. FIG. 3 is an illustrative top view of the light-emitting unit 200 of the present embodiment. The schematic cross section shown in FIG. 1 and FIG. 2 corresponds to part of the cross section taken along line A-A' of FIG. 3. In these drawings, the x axis, the y axis and the z axis, which are perpendicular to one another, are shown. The directions indicated by the x axis, the y axis and the z axis shown in the drawings of the present disclosure are common among all of the drawings.

The light-emitting unit 200 includes a wiring board and a light source portion 100 mounted onto the wiring board 10. In the configurations illustrated in FIG. 1 and FIG. 2, the light source portion 100 includes a plurality of light-emitting elements 20, a light reflecting member 30 covering at least lateral surfaces of each of the light-emitting elements 20, a plurality of wavelength conversion layers 40, a plurality of light reflecting layers 50, and a protecting layer 60. The total thickness (i.e., the height in the z direction) of the light-emitting unit 200 is, for example, about 0.60 mm. As illustrated in FIG. 3, a typical example of the shape of the light source portion 100 is a rectangular shape in a top view. The length in the x direction, $Lx_1$, and the length in the y direction, $Ly_1$, of the light source portion 100 are, for example, about 52.0 mm.

The plurality of light-emitting elements 20 can be arrayed one-dimensionally or two-dimensionally over the upper surface 10a of the wiring board 10. In the present embodiment, the plurality of light-emitting elements 20 are arrayed two-dimensionally along two directions which are perpendicular to each other (herein, the x direction and the y direction). In the example shown in FIG. 3, 26 light-emitting elements 20 are arrayed along the x direction, and 26 light-emitting elements 20 are arrayed along the y direction. That is, the light source portion 100 includes 676 light-emitting elements 20. In this example, the arrangement pitch px in the x direction and the arrangement pitch py in the y direction are equal. Herein, the arrangement pitch of the light-emitting elements means the distance between the optical axes L of two adjoining light-emitting elements which are perpendicular to the emission surfaces (see, for example, FIG. 1). Each of the arrangement pitches px, py can be not less than 0.5 mm and not more than 10.0 mm. In the present embodiment, each of the arrangement pitches px and py can be about 2.0 mm.

As schematically shown in FIG. 1 and FIG. 2, the plurality of light-emitting elements 20 are provided in the light source portion 100. In the configuration illustrated in FIG. 3, the light source portion 100 includes 676 regions each of which includes a single light-emitting element 20. In the following sections, for the sake of convenience in description, the section which includes a single light-emitting element is also referred to as "segment" or "individual region". Hereinafter, respective components will be described in detail.

Wiring Board 10

The wiring board 10 has the upper surface 10a and a lower surface 10b. On the upper surface 10a side of the wiring board 10, the plurality of light-emitting elements 20 are provided and supported. The wiring board 10 includes an insulating layer 11 and a plurality of conductor wire layers (or metal layers) each of which has a wiring pattern. In the present embodiment, the wiring board 10 has a multilayer structure including a first conductor wire layer 12a and a second conductor wire layer 12b. The first conductor wire layer 12a and the second conductor wire layer 12b are electrically connected together through a via 13 provided in the insulating layer 11. Part of the insulating layer 11 covers the upper surface 10a of the wiring board 10 exclusive of a region to which the light-emitting element 20 is mounted. The wiring patterns of the conductor wire layers will be described later in detail.

A typical example of the wiring board 10 is a flexible printed circuit (FPC) which can be manufactured by a roll-to-roll method. In the present embodiment, an FPC is described as an example of the wiring board 10 to which the light source portion 100 is mounted. The FPC includes a film-shaped insulator (e.g., resin film) and a conductor wire layer which is formed of, for example, copper. Examples of the resin material that forms the insulator of the FPC include phenolic resins, epoxy resins, polyimide resins, BT resins, polyphthalamide (PPA), and polyethylene terephthalate (PET). Using an FPC as the wiring board 10 can reduce the weight and thickness of the light-emitting unit.

For example, the length in the x direction of the wiring board 10, $Lx_2$, is about 55.0 mm and the length in the y direction, $Ly_2$, is about 60.0 mm. The thickness of the wiring board 10 (i.e., the height in the z direction in the drawings) can be about 0.170 mm.

From the viewpoint of good in thermal resistance and light resistance, a ceramic material may be selected as the material of the wiring board 10. In such a case, the wiring board 10 is a rigid substrate. The rigid substrate can be a substrate which is thin enough to be flexible. Examples of the ceramic material include alumina, mullite, forsterite, glass ceramic materials, nitrides (e.g., AlN), and carbides (e.g., SiC).

The insulator of the wiring board 10 can be formed of a composite material such as a fiberglass-reinforced plastic (e.g., glass epoxy resin). That is, an inorganic filler, such as glass fiber, $SiO_2$, $TiO_2$, $Al_2O_3$, or the like, can be mixed in the above-described resin material. This may improve the mechanical strength of the wiring board 10. Also, the coefficient of thermal expansion may be reduced, and the reflectance may be improved.

In each of the configurations illustrated in FIG. 1 and FIG. 2, the first conductor wire layer 12a is provided on the upper surface 10a side of the wiring board 10. Each of the plurality of light-emitting elements 20 has an anode 21a and a cathode 21c which are electrically connected with the first conductor wire layer 12a. On the other hand, the second conductor wire layer 12b is provided on the lower surface 10b side of the wiring board 10. The second conductor wire layer 12b has a wiring pattern for supplying electric power from an external control circuit (not shown) to the plurality of light-emitting elements 20 via a connector C of the wiring board 10 (see FIG. 3). The material of the conductor wire layers can be appropriately selected according to the material used for the insulator of the wiring board 10, the manufacturing method, etc. For example, in the case in which the material of the insulator of the wiring board 10 is an epoxy resin, the material of the conductor wire layers is preferably a material which can be easily processed. For example, the conductor wire layers of the wiring board 10 can be realized by forming a metal layer of copper, nickel, or the like, by plating, sputtering, deposition, or pressure bonding and processing the metal layer by photolithographically or the like into a predetermined wiring pattern. Alternatively, the conductor wire layers can be realized by printing. By coating the wiring pattern with a solder resist, oxidation of the surface of the wiring pattern can be suppressed.

In the case in which the material of the insulator of the wiring board 10 is a ceramic material, a refractory metal which can be sintered simultaneously with the ceramic material can be employed as the material of the conductor wire layers. For example, the conductor wire layers can be formed of a refractory metal such as tungsten, molybdenum, or the like. The conductor wire layers can have a multilayer structure. For example, the conductor wire layers can include a pattern of a refractory metal, which is formed by the above-described method, and a metal layer of a different metal such as nickel, gold, silver, or the like, which is formed on the pattern by plating, sputtering, deposition, or the like.

An example of the wiring pattern which can be provided in the wiring board 10 is described in detail with reference to FIG. 4 and FIG. 5.

Figure 4:
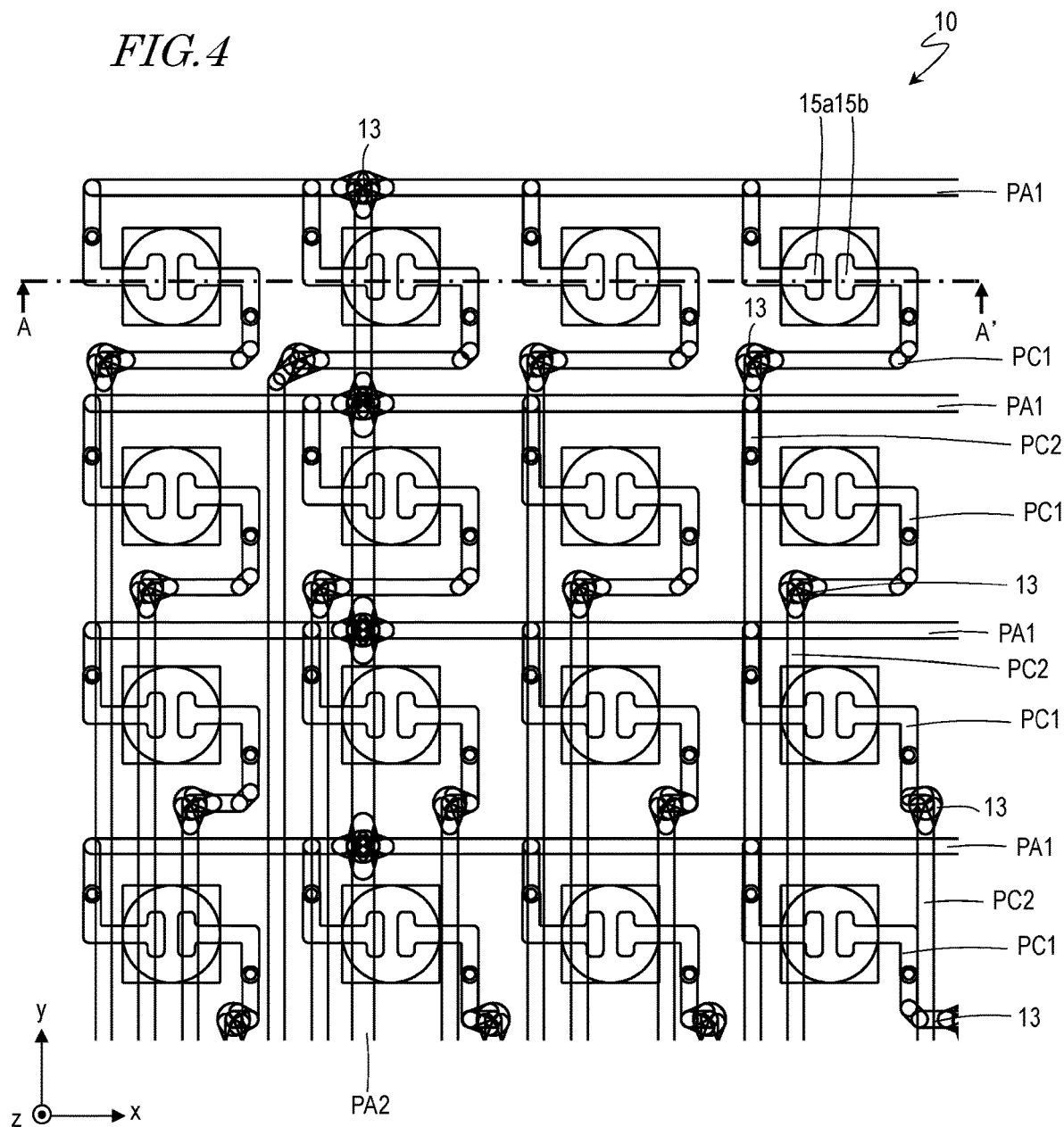
FIG. 4 is a diagram schematically and enlargedly showing a region including 4×4 segments enclosed by a broken-line rectangle shown in FIG. 3.

FIG. 4 enlargedly shows a region including 4×4 segments enclosed by a broken-line rectangle shown in FIG. 3 (hereinafter, also simply referred to as "segment region"). FIG. 5 shows a layout example of a wiring pattern in the segment region.

676 light-emitting elements 20 which are two-dimensionally arrayed are electrically connected with a wiring pattern provided in the first conductor wire layer 12a. The wiring pattern provided in the first conductor wire layer 12a is electrically connected with a wiring pattern provided in the second conductor wire layer 12b through the via 13. The wiring pattern provided in the second conductor wire layer 12b is electrically connected with the connector C. This electrical connection enables supply of electric power from an external control circuit (not shown) to the plurality of light-emitting elements 20 via the connector C of the wiring board 10.

Figure 5:
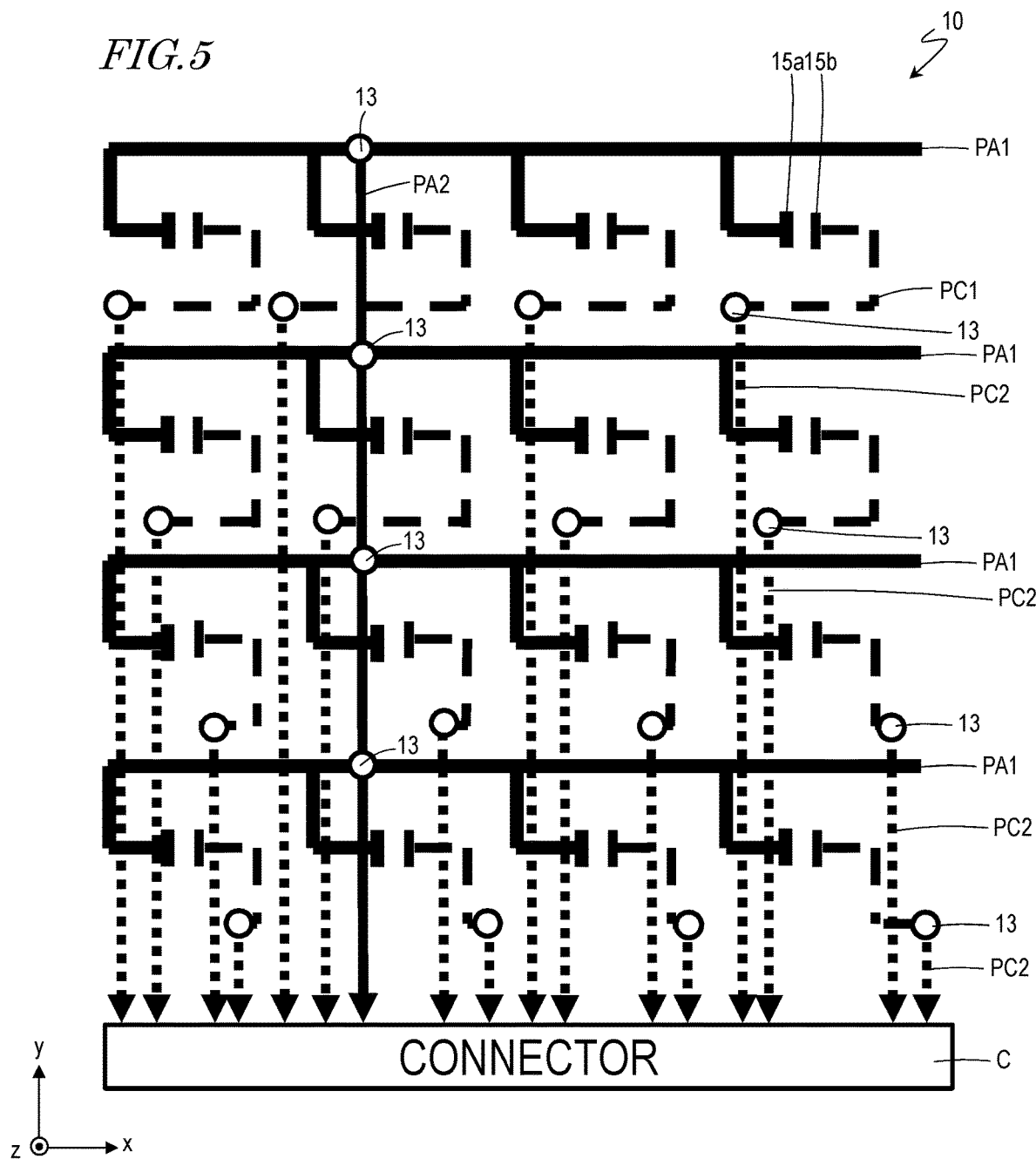
FIG. 5 is a diagram for illustrating a layout example of a wiring pattern in the segment region shown in FIG. 4.

FIG. 5 shows an example of the shape of an anodic land 15a and a cathodic land 15b, which are provided for mounting the anode 21a and the cathode 21c of the light-emitting element 20 of each segment to the wiring pattern provided in the first conductor wire layer 12a. In the example shown in FIG. 4 and FIG. 5, the first conductor wire layer 12a includes a plurality of wiring patterns PA1, each of which extends in the x direction. These wiring patterns PA1 are provided along the y direction of the segment array of 4 rows and 4 columns. Each of the wiring patterns PA1 connects among a plurality of lands 15a located in the same row. That is, each of the wiring patterns PA1 electrically connects together the anodes 21a of a plurality of light-emitting elements 20 located in the same row. A plurality of wiring patterns PA1 located in a plurality of rows are electrically connected with a common wiring pattern PA2 provided in the second conductor wire layer 12b through the via 13. The wiring pattern PA2 extends in the y direction, and is connected with the connector C. This electrical connection enables supply of a common voltage driving signal from the wiring pattern PA2 to the anodes 21a of all of the light-emitting elements 20.

The first conductor wire layer 12a also includes a wiring pattern PC1 provided in each segment. The wiring pattern PC1 is connected with the cathodic land 15*b*, and is electrically connected with a wiring pattern PC2 through the via 13. The wiring pattern PC2 is provided for each segment in the second conductor wire layer 12*b* and is connected with the connector C. This electrical connection enables supply of a voltage driving signal to the cathode 21*c* of each light-emitting element 20 via the wiring pattern PC2 on a segment-by-segment basis.

The above-described anodic and cathodic wiring patterns enable matrix driving of the light-emitting element in each segment. The light source portion 100 is capable of a local dimming operation.

Light-Emitting Elements 20

FIG. 1 is referred to again. As previously described, in the present embodiment, the plurality of light-emitting elements 20 are two-dimensionally arrayed along the x direction and the y direction, and the arrangement pitch px in the x direction and the arrangement pitch py in the y direction are equal. However, the arrangement of the plurality of light-emitting elements 20 is not limited to this example. The arrangement pitch of the light-emitting elements can be different between the x direction and the y direction. The two directions of the two-dimensional array of the plurality of light-emitting elements 20 may not be perpendicular to each other. The arrangement pitch is not limited to equal intervals, but can be unequal intervals. For example, the plurality of light-emitting elements 20 can be arrayed such that the intervals increase from the center to the periphery of the wiring board 10.

The light-emitting elements 20 are semiconductor light-emitting elements. As the light-emitting elements 20, a known light-emitting element such as semiconductor laser, light-emitting diode, or the like, can be used. In the present embodiment, a light-emitting diode is illustrated as an example of the light-emitting elements 20. A wavelength of light emitted from the light-emitting elements 20 can be appropriately selected. For example, as a light-emitting element which is capable of emitting light with a wavelength from blue to green, a semiconductor light-emitting elements can be used in which ZnSe, a nitride semiconductor ($In_xAl_yGa_{1-x-y}N$, $0 \leq X$, $0 \leq Y$, $X+Y \leq 1$), or GaP is used. As a light-emitting element which is capable of emitting light with a wavelength of red, a semiconductor light-emitting element can be used which includes a semiconductor such as GaAlAs, AlInGaP, or the like. Alternatively, a semiconductor light-emitting element which is made of a material other than those mentioned herein can also be used for the light-emitting elements 20. The composition of the semiconductor used and the emission color, size and number of the light-emitting elements can be appropriately selected according to purposes and design specifications.

The light-emitting elements 20 includes, for example, a light-transmitting substrate and a semiconductor multilayer structure formed on the substrate. The semiconductor multilayer structure includes an active layer, and an n-type semiconductor layer and a p-type semiconductor layer between which the active layer is interposed. The light-emitting elements 20 preferably includes a nitride semiconductor ($In_xAl_yGa_{1-x-y}N$, $0 \leq X$, $0 \leq Y$, $X+Y \leq 1$) which is capable of emitting light with a short wavelength. This enables efficient excitation of phosphors in a wavelength conversion layer 40 that will be described later. According to the material and/or the mixed crystal ratios of the semiconductor, the emission wavelength can be variously selected.

The cathode 21*c* and the anode 21*a* are electrically connected with the n-type semiconductor layer and the p-type semiconductor layer, respectively. The light-emitting element 20 has an upper surface (or emission surface) 20*a* from which light is emitted and a lower surface 20*b* which is opposite to the upper surface 20*a*. The light-emitting element 20 can have both the anode and the cathode on the same surface side or can have the anode and the cathode on different surfaces. In the present embodiment, both the anode 21*a* and the cathode 21*c* are located on the lower surface 20*b* side.

The anode 21*a* and the cathode 21*c* of the light-emitting element 20 are electrically connected with, and fixed to, the first conductor wire layer 12*a* provided at the upper surface 10*a* side of the wiring board 10. In the present embodiment, an FPC can be used for the wiring board 10. The light-emitting element 20 can be mounted in the form of the light source portion 100 to the wiring board 10 or can be directly mounted to the wiring board 10.

The light-emitting element 20 is typically a bare chip. The light-emitting element 20 can include a lens, or the like, for widening the emission angle of light emitted from the upper surface 20*a*. The height in the z direction from the upper surface 10*a* of the wiring board 10 to the upper surface 20*a* of the light-emitting element 20 can be, for example, about 0.425 mm.

The plurality of light-emitting elements 20 provided in the light-emitting unit 200 can include two or more types of light-emitting elements. The plurality of light-emitting elements 20 can include, for example, light-emitting elements which are capable of emitting light at a wavelength of blue, light-emitting elements which are capable of emitting light at a wavelength of green, and light-emitting elements which are capable of emitting light at a wavelength of red. The type of the light-emitting elements used in the light-emitting unit 200 can be determined from the viewpoint of improving the color rendering properties of light emitted from the light-emitting unit 200.

Light Reflecting Member 30

The light reflecting member 30 is provided on the wiring board 10 and covers the upper surface 10*a* of the wiring board 10 and the lateral surfaces 20*c* of each of the plurality of light-emitting elements 20. The light reflecting member 30 can be formed so as to cover the anode 21*a* and the cathode 21*c* and to at least partially fill the gap between the lower surface 20*b* of the light-emitting elements 20 and the upper surface 10*a* of the wiring board 10. However, the gap can be filled with an underfill in place of the light reflecting member 30. Formation of the underfill allows to relieve the stress which can be caused by the difference in the coefficient of thermal expansion between the light-emitting elements 20 and the wiring board 10 and to improve the heat dissipation.

The light reflecting member 30 can be formed of a material which contains a resin and particles of a reflective material dispersed in the resin. Examples of the reflective material particles include particles of oxides, such as titanium oxide, aluminum oxide, silicon oxide, and zinc oxide. The average particle size of the oxide particles is, for example, approximately, not less than 0.05 μm and not more than 30 μm. The light reflecting member 30 can further contain a pigment, a light absorbing material, a phosphor, etc. For the resin material for being formed of the light reflecting member 30, a photocurable resin whose primary component is an acrylate resin, an epoxy resin, or the like, can be used. The reflective material particles which can scatter light can be uniformly distributed in the light reflecting member 30.

The upper surface 30*a* of the light reflecting member can have a recess 31 (second recess) which includes at least one concave surface 31c. The shape of the recess 31 can be defined by a sink mark (or shrinkage cavity) which can occur after the resin material is cured in production of the light reflecting member 30. The recess 31 can have a plurality of continuously-formed concave surfaces 31c. For example, in a top view, the upper surface 30a of the light reflecting member 30 can have a recess 31, which has a plurality of continuously-formed concave surfaces 31c, in a region between the plurality of light-emitting elements 20. More specifically, the recess 31 can be configured as part of groove extending in the x direction and as part of groove extending in the y direction. In a top view, each of the plurality of grooves extending in the x direction is located between the upper surfaces 20a of two light-emitting elements 20 adjoining each other in the y direction, and each of the plurality of grooves extending in the y direction is located between the upper surfaces 20a of two light-emitting elements 20 adjoining each other in the x direction. The plurality of grooves extending in the x direction and the plurality of grooves extending in the y direction can intersect one another.

In the upper surface 30a of the light reflecting member 30 exclusive of the regions of the plurality of upper surfaces 20a of the plurality of light-emitting elements 20, the plurality of grooves extending in the x direction and the plurality of grooves extending in the y direction can be provided. These grooves intersect one another, so that recess(es) 31 can be provided in the upper surface 30a in a lattice arrangement. The shape of the recess(es), specifically the curvature of the concave surfaces of sink marks, can be controlled by adjusting the density of the reflective material contained in the resin. Theoretically, precisely controlling the shape of a plurality of concave surfaces is also possible. As will be described later, resin material that forms the protecting layer 60 can be provided in the recess(es) 31.

The light reflecting member 30 has the function of protecting the plurality of light-emitting elements 20. Also, the light reflecting member 30 has the function of reflecting light emitted from the light-emitting elements 20, particularly from the lateral surfaces 20c, and guiding the light to a region above the light-emitting elements 20. As a result, the utilization efficiency of light emitted from the light-emitting elements 20 can be improved. The light reflecting member 30 also has the function of reflecting light entering from the wavelength conversion layer 40 (described later) into the protecting layer 60 and guiding the light toward a side of the light source portion 100 which is opposite to the wiring board 10. In addition, in the case in which the upper surface 30a has the recess(es) 31, the number of reflections of light can increase in the light reflecting member 30 due to the concave surfaces of the sink marks, and therefore, the light extraction efficiency can be further improved. The light reflecting member 30 which is also provided on the lower surface 20b side of the light-emitting elements 20 allows light traveling toward the upper surface 10a of the wiring board 10 to be reflected by the light reflecting member 30 and guided to a region above the light-emitting elements 20. As a result, the utilization efficiency of light emitted from the light-emitting elements 20 can be improved.

Wavelength Conversion Layer 40

A wavelength conversion layer 40 is provided above the emission surface 20a of a corresponding one of the plurality of light-emitting elements 20. In other words, the plurality of wavelength conversion layers 40 are respectively provided above the plurality of light-emitting elements 20. As shown in FIG. 2, the light-emitting unit 200 can further include a plurality of adhesion layers 45 between the plurality of emission surfaces 20a of the plurality of light-emitting elements 20 and the plurality of wavelength conversion layers 40. That is, an adhesion layer 45 can be provided between the upper surface 20a of each of the plurality of light-emitting elements 20 and one of the plurality of wavelength conversion layers 40 corresponding to that light-emitting element 20.

The wavelength conversion layer 40 is typically made of a material in which phosphor particles are dispersed in a resin. The wavelength conversion layer 40 absorbs at least part of light emitted from the light-emitting element 20 and emits light at a wavelength different from the wavelength of the light emitted from the light-emitting element 20. For example, the wavelength conversion layer 40 converts the wavelength of part of blue light from the light-emitting element 20 and emits yellow light. With such a configuration, blue light which has passed through the wavelength conversion layer 40 and yellow light emitted from the wavelength conversion layer 40 are mixed together, resulting in white light. The thickness of the wavelength conversion layer 40 can be in the range of, for example, not less than 100 µm and not more than 200 µm. In the present embodiment, the thickness of the wavelength conversion layer 40 can be, for example, about 100 µm.

Examples of the base material in which particles of a phosphor or the like are dispersed include silicone resins, modified silicone resins, epoxy resins, modified epoxy resins, urea resins, phenolic resins, acrylic resins, urethane resins, and fluoric resins, and a material containing two or more of these resins. A material having a refractive index different from a refractive index of the base material can be dispersed in the material of the wavelength conversion layer 40 such that the wavelength conversion layer 40 can have a light diffusion function. For example, particles of titanium oxide, aluminum oxide, silicon oxide, zinc oxide, or the like, can be dispersed in the base material of the wavelength conversion layer 40.

The phosphor can be a known material. Examples of the phosphor include fluoride-based phosphors such as KSF-based phosphors, nitride-based phosphors such as CASN, YAG-based phosphors, and β-SiAlON phosphors. Examples of the YAG-based phosphors include a phosphor which is capable of converting blue light to yellow light. Examples of the KSF-based phosphors and CASN include a phosphor which is capable of converting blue light to red light. Examples of the β-SiAlON phosphors include a phosphor which is capable of converting blue light to green light. The phosphor can be a quantum dot phosphor.

The wavelength conversion layer 40 can contain a plurality of types of phosphors, for example, a phosphor which is capable of converting blue light to red light and a phosphor which is capable of converting blue light to green light. In such a case, the light-emitting unit 200 can have a configuration in which blue light emitted from the light-emitting element 20 to enter the wavelength conversion layer 40 such that red light, blue light and green light are mixed together, to thereby emit white light. It is not required that the phosphors contained in the plurality of wavelength conversion layers 40 provided in the light-emitting unit 200 are common among the wavelength conversion layers 40. The phosphors contained can also differ among the plurality of wavelength conversion layers 40.

Light Reflecting Layer 50

As shown in FIG. 1 and FIG. 2, the plurality of light reflecting layers 50 are respectively provided on the plurality of wavelength conversion layers 40. Each of the light reflecting layers 50 is a semi-light-shielding layer which is capable of transmitting part of incoming light and reflecting other part of the incoming light. The thickness of the light reflecting layers 50 can be in the range of, for example, not less than 50 μm and not more than 100 μm. In the present embodiment, the thickness of the light reflecting layers 50 can be, for example, about 50 μm. As the materials of the light reflecting member 30, the light reflecting layers can be formed of a material which contains a resin and oxide particles such as titanium oxide, aluminum oxide, silicon oxide, or the like, which are the reflective material particles dispersed in the resin. The average particle size of the oxide particles is, for example, about not less than 0.05 μm and not more than 30 μm. The light reflecting layers 50 can further contain a pigment, a light absorbing material, a phosphor, etc. For the resin material for being formed of the light reflecting layers 50, a photocurable resin whose primary component is an acrylate resin, an epoxy resin, or the like, can be used.

In a top view, the plurality of wavelength conversion layers 40 overlap the plurality of light reflecting layers 50. However, each of the plurality of wavelength conversion layers 40 only need to overlap at least part of a corresponding one of the plurality of light reflecting layers 50. At least a portion of the wavelength conversion layer 40 or at least a portion of the light reflecting layer 50 includes the emission surface 20a of a corresponding one of the plurality of light-emitting elements 20 in a top view. That is, when one segment is focused, the area of the region of the wavelength conversion layer 40 or the light reflecting layer 50 is equal to or greater than the area of the emission surface 20a in a top view. The center of the region of the light reflecting layer 50 and the center of the region of the wavelength conversion layer 40 are preferably on the optical axis L extending in a direction perpendicular to the emission surface 20a of a corresponding light-emitting element 20.

The region of each of the plurality of light reflecting layers 50 (or the plurality of wavelength conversion layers 40) typically has a rectangular shape in a top view. For example, the region of the light reflecting layer 50 can be square, and the length of one side of the square region can be about 0.5 mm. However, the region of the light reflecting layer 50 can be circular.

Due to the light reflecting layer 50 that is provided immediately above the light-emitting element 20, light outgoing from the wavelength conversion layer 40 in a direction parallel to the optical axis L is effectively blocked, to thereby improve the luminance in a region exclusive of the region immediately above the light-emitting element 20. In other words, the unevenness in luminance at the upper surface of the light-emitting unit 200 is effectively inhibited, and more uniform light can be achieved.

In the present embodiment, the distance from the emission surface 20a of the light-emitting element 20 to the light reflecting layer 50 is about 100 μm, which is very short. Thus, by arranging the region of the light reflecting layer 50 so as to be perfectly coincident with the emission surface 20a in a top view, the luminance in a region immediately above the light-emitting element 20 can be suppressed, and the luminance in a region exclusive of the region immediately above the light-emitting element 20, while the area of the light reflecting layer 50 is reduced. In the case in which the area of the light reflecting layers 50 has a circular shape and the emission surface 20a of the light-emitting element 20 has a square shape, the diameter of the region of the light reflecting layer 50 can be identical with the length of a diagonal of the square shape of the emission surface 20a.

Each of the plurality of light reflecting layers 50 can have a dotted reflection pattern in a top view. That is, each of the light reflecting layers 50 can be an aggregate of a plurality of light reflecting members each having the shape of a dot. In such a case, the dot density of the reflection pattern in the light reflecting layer 50 can increase from the periphery to the center of the region of the light reflecting layer 50. As an example, the dotted reflection pattern can be a pattern defined by the distribution of reflective material particles which scatter light in the light reflecting layer 50. The density of the distributed reflective material particles is higher in a region where the absolute value of the light distribution angle of the light-emitting element 20 is small (i.e., the angular range where the inclination from the optical axis L is small) than in a region where the absolute value of the light distribution angle is large. In this way, the light transmittance can be changed according to the absolute value of the light distribution angle, and the reflectance and transmittance of light can be controlled according to the density of dots. In another example, by controlling the thickness of the light reflecting layer 50, the light transmittance can be changed according to the absolute value of the light distribution angle. As the absolute value of the light distribution angle of the light-emitting element 20 decreases, i.e., as the position approaches from the periphery of the region of the light reflecting layer 50 to the optical axis, the thickness of the light reflecting layer 50 can be gradually increased.

Protecting Layer 60

The protecting layer 60 is provided on the light reflecting member 30 and covers at least the lateral surfaces of the plurality of wavelength conversion layers 40 and at least the lateral surfaces of the plurality of light reflecting layers 50. As shown in FIG. 1, the protecting layer 60 can be formed so as to cover a plurality of upper surfaces 50a of the plurality of light reflecting layers 50.

In the example shown in FIG. 1, the upper surface 60a of the protecting layer 60 is a flat surface in the region located above the light reflecting layer 50. However, the upper surface 60a of the protecting layer 60 may be a curved surface that is convex toward the upper side of the protecting layer 60 in the region located above the light reflecting layer 50. In this case, on the upper surface 60a of the protecting layer 60, the height difference between the central portion and the peripheral portion in the region located above the light reflecting layer 50 can be set in the range of, for example, not less than 10 nm and not more than 50 μm.

Alternatively, as shown in FIG. 2, the plurality of upper surfaces 50a may not be covered with the protecting layer 60. That is, the plurality of upper surfaces 50a can be exposed from the protecting layer 60.

In the present embodiment, the protecting layer 60 is a light-transmitting resin layer. The upper surfaces 30a of the light reflecting members 30 which face the protecting layer 60 are in contact with the protecting layer 60. As the material of the protecting layer 60, for example, an acrylic resin, an epoxy resin, a silicone resin, or a resin material prepared by mixing these resins together can be used. The protecting layer 60 can contain a light diffusing material of titanium oxide, aluminum oxide, silicon oxide, zinc oxide, or the like. With this case, light entering from the wavelength conversion layer 40 into the protecting layer 60 or light reflected by the light reflecting member 30 can be diffused. As a result, unevenness in luminance at the upper surface of the light-emitting unit 200 can be suppressed. The thickness of the protecting layer 60 (i.e., the distance from the upper surface 30a of the light reflecting member 30 to the upper surface 60a of the protecting layer 60 along the z direction of the drawing) can be, for example, about 150 µm.

The upper surface 60a of the protecting layer 60 has a recess 61 (first recess) which includes at least one concave surface 61c. The shape of the recess 61 can be defined by a sink mark which can occur after the resin material is cured in production of the protecting layer 60. For example, the recess 61 can have a plurality of continuously-formed concave surfaces 61c. In the drawings of the present application, for example in FIG. 1 and FIG. 2, particularly the shape of the recess 61 is exaggerated from the viewpoint of easy understanding. In a top view, the upper surface 60a of the protecting layer 60 can have a plurality of concave surfaces 61c continuously formed in regions of the upper surface 60a extending between the plurality of light reflecting layers 50.

The recess 61 can have a shape which has a plurality of concave surfaces extending in the x direction or the y direction in the upper surface 60a of the protecting layer 60 exclusive of the region overlapping the plurality of light reflecting layers 50 in a top view. For example, the plurality of grooves each extending in the x direction and the plurality of grooves each extending in the y direction intersect one another, whereby the recess(es) 61 can be provided in the upper surface 60a in a lattice arrangement. In the cross-sectional structure shown in FIG. 1, the bottom 61a of each of the concave surfaces 61c (i.e., the lowest portion of the upper surface 60a) is located at a level lower than the upper surface of the wavelength conversion layer 40, i.e., located on the light reflecting member 30 side. The shape of the recess(es), specifically the curvature of the concave surfaces of sink marks, can be controlled by adjusting the concentration of the resin material. Also, precisely controlling the shape of a plurality of concave surfaces is possible.

The light-emitting unit 200 is configured by plurality of members formed of different materials. Therefore, stress may occur due to the difference in coefficient of thermal expansion among the members, and this may result in warpage in the light-emitting unit 200. Generally, a member which is formed of a resin material as a main material is more likely to thermally expand than an FPC. For example, during the operation of the light-emitting unit 200, the light-emitting elements 20 produce heat and accordingly the internal temperature increases, and in some cases, warpage may occur in the light-emitting unit 200 due to the difference in coefficient of thermal expansion between the wiring board 10 and the other members (e.g., the protecting layer 60, the light reflecting member 30, and the like). At least one of the protecting layer 60 and the light reflecting member 30 can have a greater coefficient of thermal expansion than that of the wiring board 10. For example, the coefficient of thermal expansion of the wiring board 10 is about 20 ppm/° C., the coefficient of thermal expansion of the light reflecting member 30 is about 100 ppm/° C., and the coefficient of thermal expansion of the protecting layer 60 is about 200 ppm/° C. Therefore, due to the heat produced by the light-emitting elements 20, the light-emitting unit 200 may warp toward the protecting layer 60 that has a large coefficient of thermal expansion (i.e., the central part of the light-emitting unit 200 may warp so as to form a convex in +z direction in the drawings).

The light-emitting unit 200 of the present embodiment has recesses 61 in the upper surface 60a of the protecting layer 60. According to a configuration which has the recesses 61 in the upper surface 60a of the protecting layer 60, the recess 61 is recessed in a direction opposite to the warpage of the light-emitting unit 200 (i.e., −z direction in the drawings). Therefore, even if a member which is primarily formed of a resin such as the protecting layer 60 and the light reflecting member 30 expands, the degree of the warpage is advantageously moderated. In the configuration illustrated in FIG. 1 and the configuration illustrated in FIG. 2, the recesses 31 are also provided on the upper surface 30a of the light reflecting member 30. The recesses 31 are also recessed in a direction opposite to the direction in which the light-emitting unit 200 is likely to warp (i.e., −z direction in the drawings), and therefore, the degree of the warpage can be further moderated. Thus, according to an embodiment of the present disclosure, the degree of the warpage which can occur due to the difference in coefficient of thermal expansion between the light reflecting member 30 or the protecting layer 60 and the wiring board 10 can be moderated.

Figure 6:
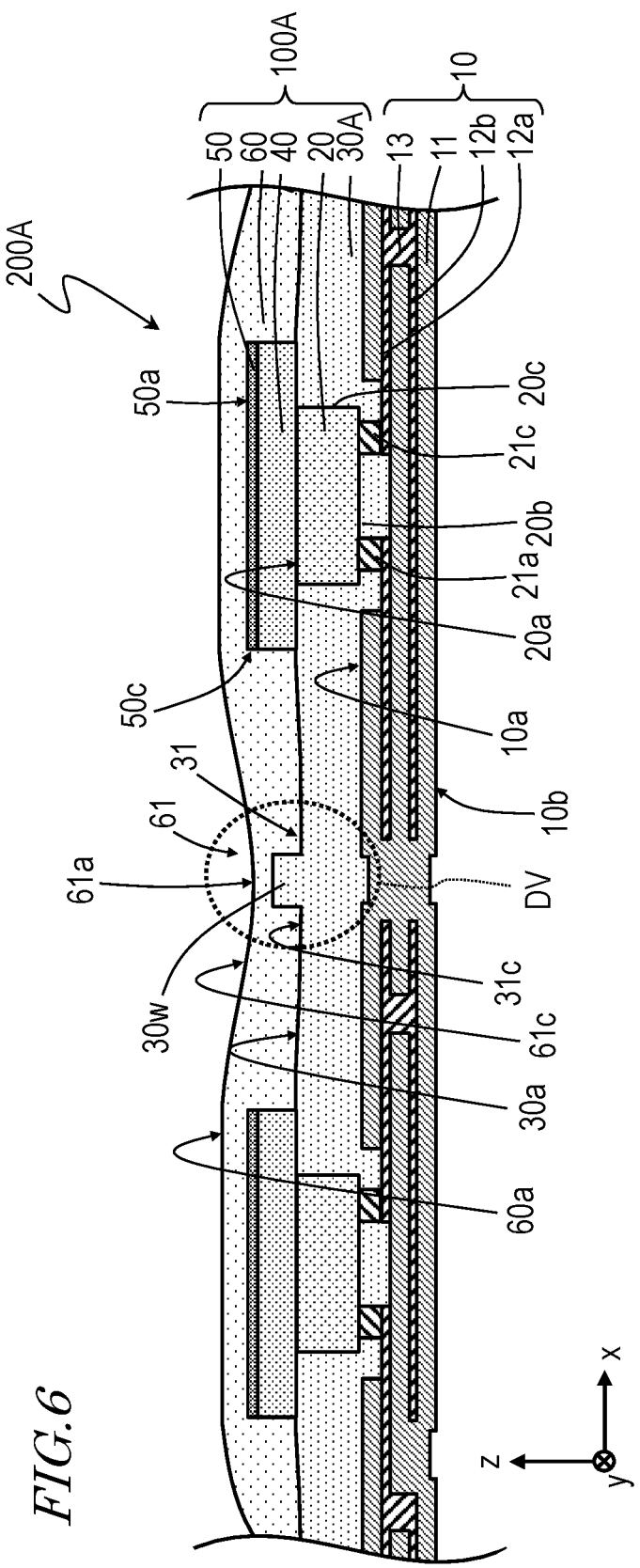
FIG. 6 is a cross-sectional view schematically showing an exemplary configuration of a light-emitting unit 200A of another embodiment of the present disclosure.
Figure 7:
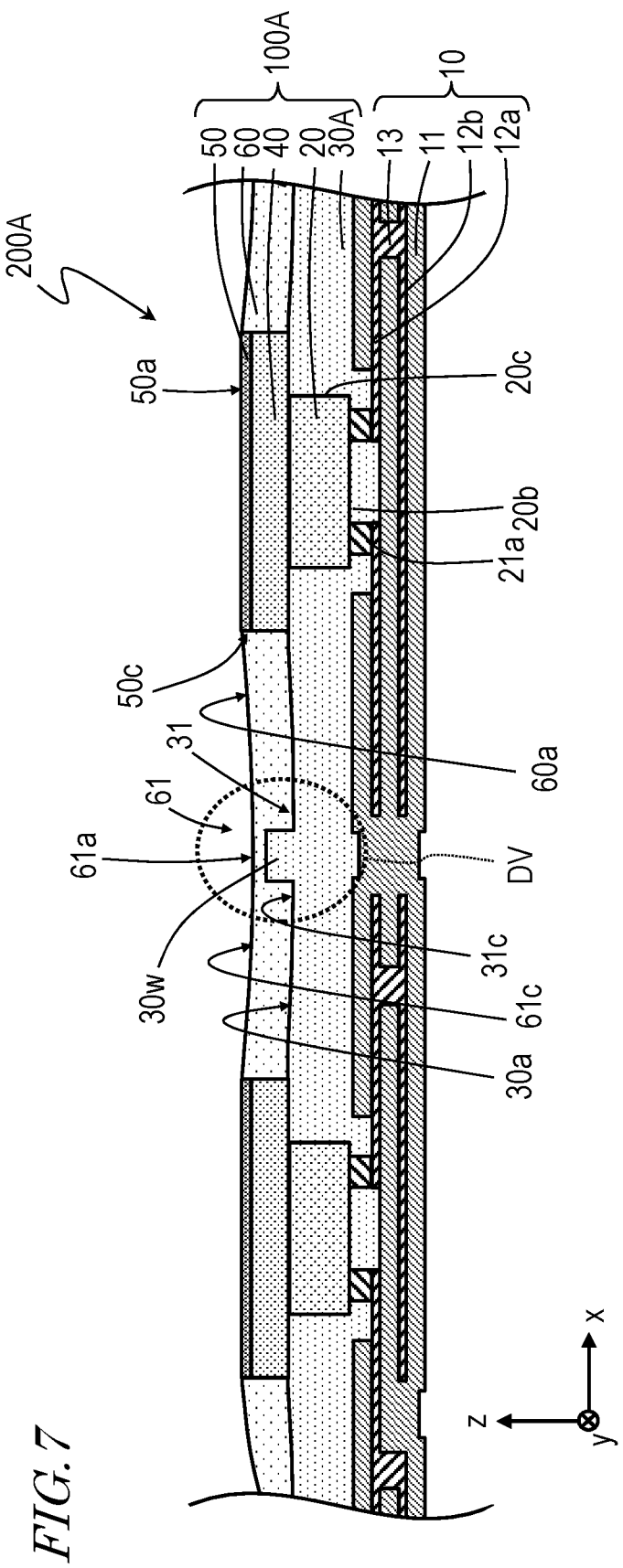
FIG. 7 is a cross-sectional view schematically showing another exemplary configuration of the light-emitting unit 200A shown in FIG. 6.

FIG. 6 is a cross-sectional view schematically showing an exemplary configuration of a light-emitting unit 200A of another embodiment of the present disclosure. FIG. 7 is a cross-sectional view schematically showing another exemplary configuration of the light-emitting unit 200A. FIG. 6 and FIG. 7 schematically show part of a cross section of the light-emitting unit 200A taken at the same position as line A-A' of FIG. 3 as do FIG. 1 and FIG. 2. In the configuration illustrated in FIG. 6, the protecting layer 60 covers the upper surfaces 50a of the light reflecting layers 50 likewise as in the example described with reference to the FIG. 1. On the other hand, in the configuration illustrated in FIG. 7, the upper surfaces 50a of the light reflecting layers 50 are exposed from the protecting layer 60 likewise as in the example described with reference to the FIG. 2.

The light-emitting unit 200A of the present embodiment has a partition DV between two adjoining light-emitting elements 20 in the array of the plurality of light-emitting elements 20 on the wiring board 10, as represented by a broken oval in FIG. 6 and FIG. 7. As will be described later, for example, the partition DV is arranged so as to surround the plurality of light-emitting elements 20, and defines individual regions each of which includes one of the plurality of light-emitting elements 20.

As compared with the light-emitting unit 200 shown in FIG. 1 and FIG. 2, the light-emitting unit 200A includes a light source portion 100A in place of the light source portion 100. The light source portion 100A includes a light reflecting member 30A in place of the light reflecting member 30. At the upper surface 30a side of the light reflecting member 30A, a protrusion 30w protruding from the light reflecting member 30A into the protecting layer 60 is formed. That is, in this example, a partition DV is provided in the light-emitting unit 200A in the form of a protrusion 30w at the upper surface 30a of the light reflecting member 30A.

In this example, the protrusion 30w is provided inside the recess 31. In a top view, if for example the recess 31 extends in a certain direction, the protrusion 30w can be linearly provided along the recess 31. In other words, the protrusion 30w can be a wall-like structure extending along the recess 31.

The highest part (crest) of the protrusion 30w relative to the upper surface 30a of the light reflecting member 30A is present between, for example, the lower surface and the upper surface of the wavelength conversion layer 40 in terms of the z direction in the drawings. As will be described later, the protrusion 30w is formed of, for example, the same material as that of the light reflecting member 30A and is accordingly capable of reflecting light. That is, the protrusion 30w as the partition DV has the function of blocking light emitted by a light-emitting element 20 in one of two adjoining individual regions from entering the other individual region.

Due to the partition DV provided so as to surround the light-emitting element 20 of each individual region, when for example the light-emitting element 20 in one of two adjoining individual regions is lit while the light-emitting element 20 in the other one of the adjoining individual regions is unlit, light is less likely to enter into the individual region in which the light-emitting element 20 is unlit. Therefore, the contrast ratio at the border between the individual regions improves, and as a result, the local dimming operation can be applied more advantageously.

Figure 8:
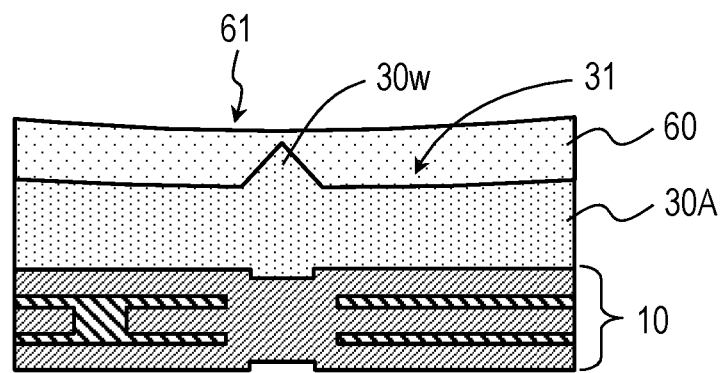
FIG. 8 is a schematic cross-sectional view showing an example of the cross-sectional shape of a protrusion 30w shown in FIG. 6 and FIG. 7.
Figure 9:
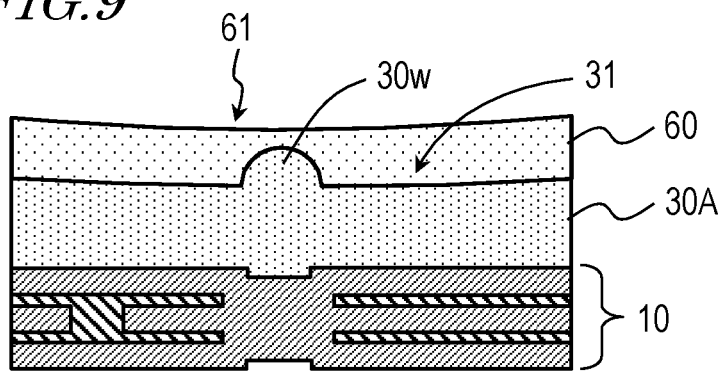
FIG. 9 is a schematic cross-sectional view showing an example of the cross-sectional shape of the protrusion 30w shown in FIG. 6 and FIG. 7.

FIG. 8 and FIG. 9 show examples of the cross-sectional shape of the protrusion 30w. The cross-sectional shape of the protrusion 30w is not limited to a rectangular shape such as shown in FIG. 6 and FIG. 7 but can be a trapezoidal shape, a triangular shape such as shown in FIG. 8, or a semicircular shape such as shown in FIG. 9. The cross-sectional shape of the protrusion 30w can alternatively be a semielliptical shape or an indefinite shape. The shape of the surface of the protrusion 30w as viewed in cross section is also not limited to a linear shape or an arc shape, but can be a curved shape or a shape which includes step(s) or bend(s).

Figure 10:
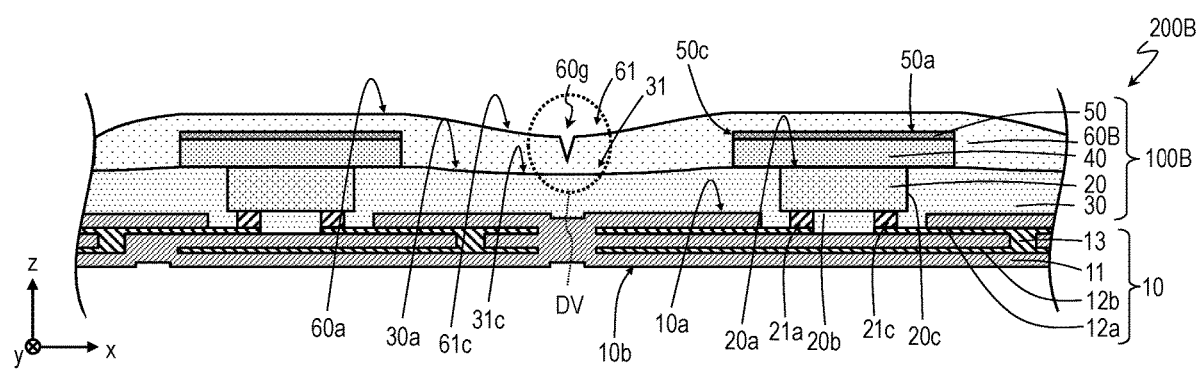
FIG. 10 is a cross-sectional view schematically showing an exemplary configuration of a light-emitting unit 200B of still another embodiment of the present disclosure.
Figure 11:
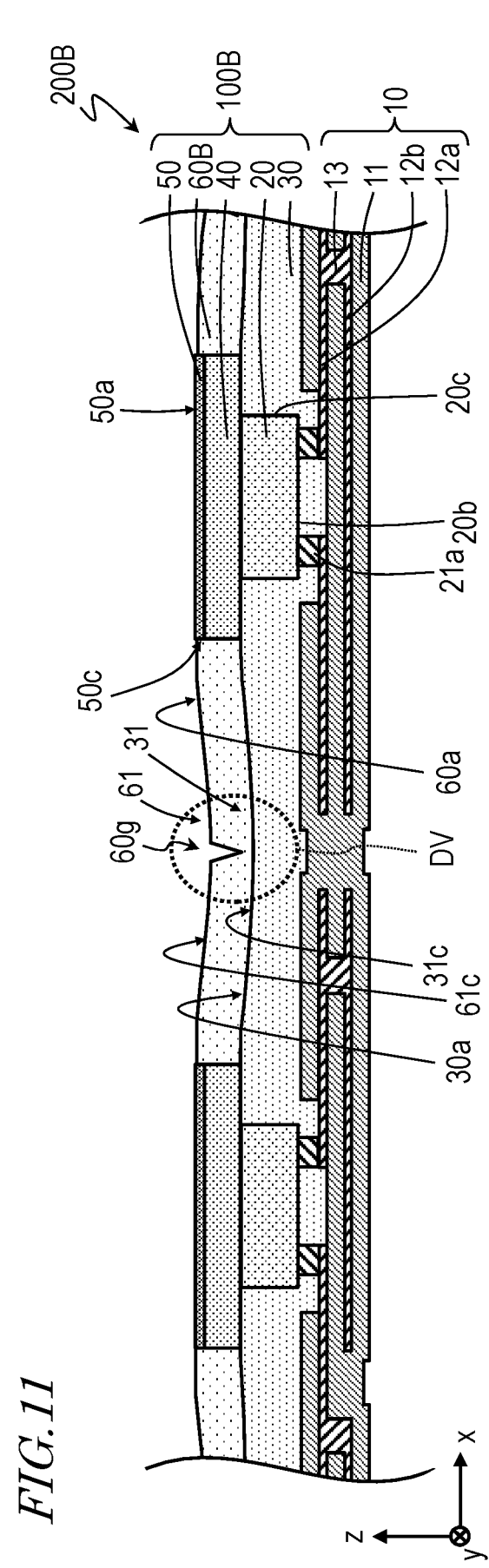
FIG. 11 is a cross-sectional view schematically showing another exemplary configuration of the light-emitting unit 200B shown in FIG. 10.

FIG. 10 is a cross-sectional view schematically showing an exemplary configuration of a light-emitting unit 200B of still another embodiment of the present disclosure. FIG. 11 is a cross-sectional view schematically showing another exemplary configuration of the light-emitting unit 200B. FIG. 10 and FIG. 11 schematically show part of a cross section of the light-emitting unit 200B taken at the same position as line A-A' of FIG. 3 as do FIG. 6 and FIG. 7.

The light-emitting unit 200B illustrated in FIG. 10 and FIG. 11 is different from the light-emitting unit 200 shown in FIG. 1 and FIG. 2 in that the light-emitting unit 200B includes, in place of the light source portion 100, a light source portion 100B which includes a protecting layer 60B in part thereof. FIG. 11 shows an example where the upper surfaces 50a of the light reflecting layers 50 are exposed from the protecting layer 60B.

The protecting layer 60B has grooves 60g as the partition DV. The grooves 60g can be a linear structure extending along the recess 31 as is the above-described protrusion 30w. Light guided from the light reflecting layers into the protecting layer 60B and incident on lateral surfaces which define the shape of a groove 60g is partially reflected at the positions of the lateral surfaces of the groove 60g. That is, due to the grooves 60g provided in the protecting layer 60B, the effect of suppressing leakage of light between two adjoining individual regions is achieved likewise as in the case where the protrusion 30w is provided as the partition DV in the light reflecting member 30A.

Figure 12:
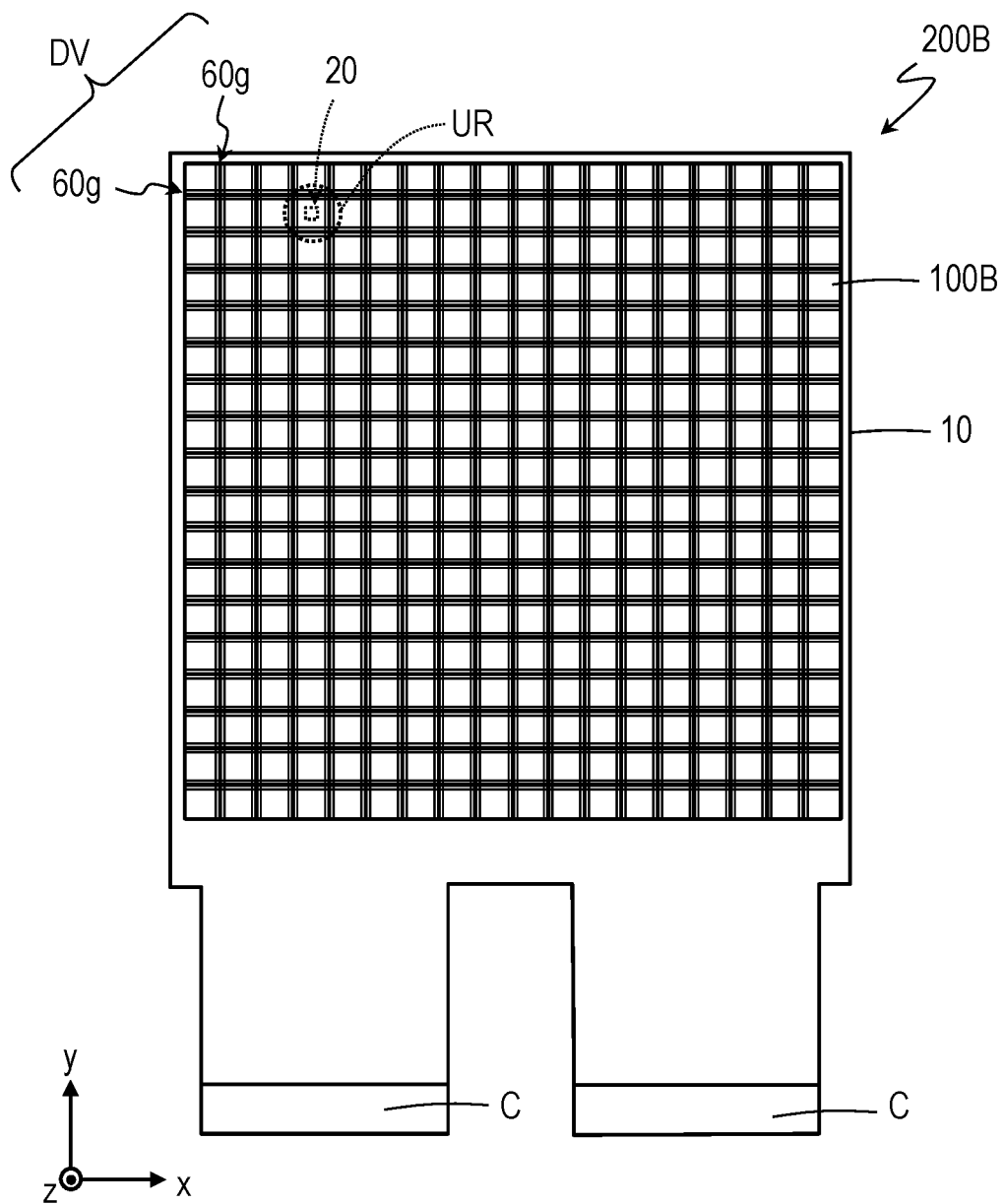
FIG. 12 is a schematic top view showing an example of the arrangement of grooves 60g as a partition DV.

FIG. 12 schematically shows an example of the arrangement of the grooves 60g as the partition DV. FIG. 12 shows an example of the arrangement of the grooves 60g in a case where the light source portion 100B has an array of individual regions in 18 rows and 18 columns. In the configuration illustrated in FIG. 12, the partition DV includes a plurality of grooves 60g. Each of these grooves 60g linearly extends in the x direction or the y direction between adjoining two of the two-dimensionally arrayed individual regions UR. In other words, the partition DV of this example is a lattice of grooves provided in the protecting layer 60B of the light source portion 100B. The width of each of the grooves 60g as see in a top is, for example, about 220 μm.

Figure 13:
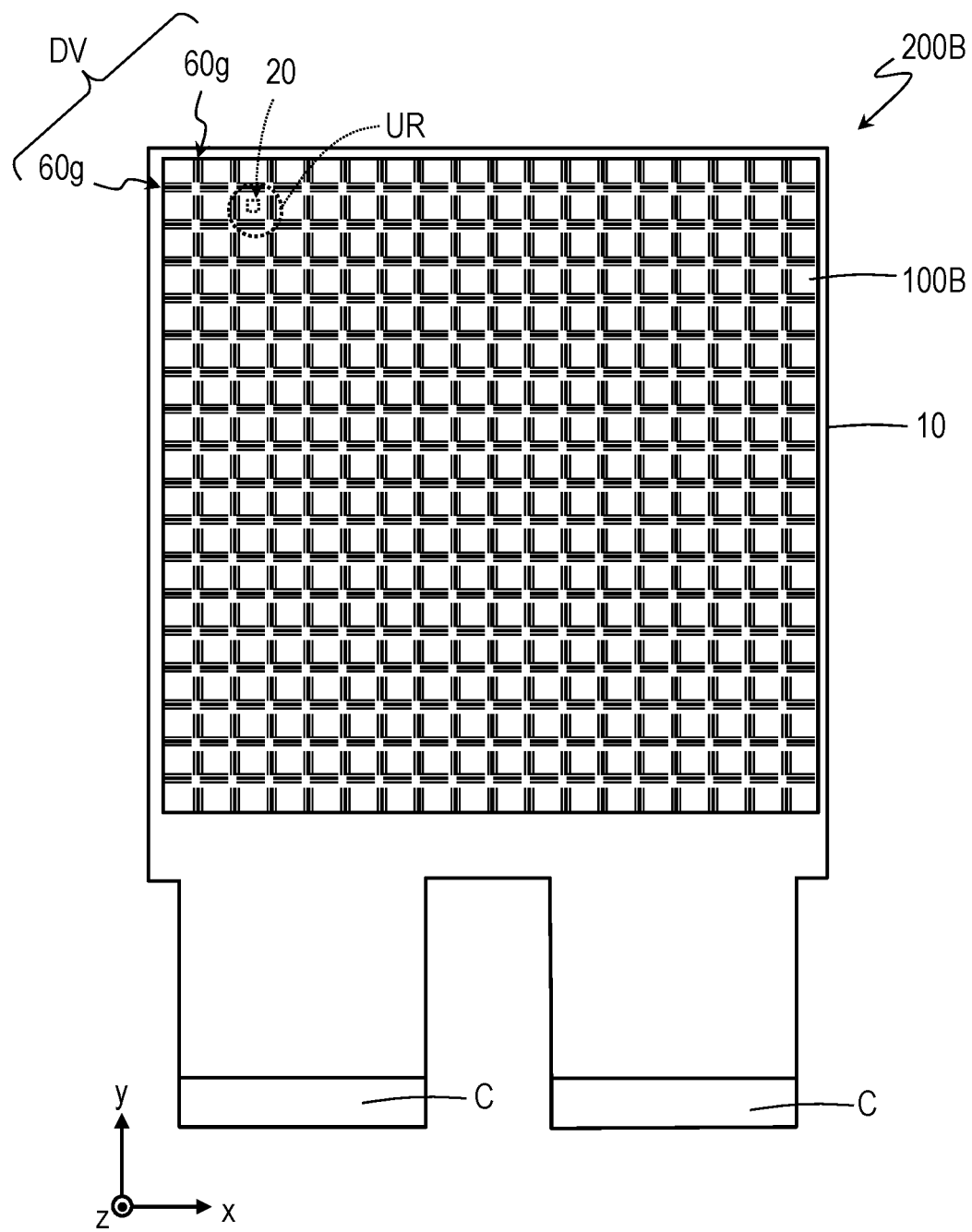
FIG. 13 is a schematic top view showing another example of the arrangement of grooves 60g as a partition DV.

The grooves 60g are not limited to a structure continuously and linearly extending in the x direction or the y direction from one end to the other of the light source portion 100B. In the configuration illustrated in FIG. 13, as for one of the two-dimensionally arrayed individual regions UR exclusive of the individual regions of the outermost rows and columns, a light-emitting element 20 included in that individual region is surrounded by four grooves 60g. As described herein, the grooves 60g only need to be arranged so as to surround the light-emitting elements 20 in the individual regions UR. It is not required that, in each of the individual regions UR, the grooves 60g have a continuous shape which surrounds the light-emitting element 20 (e.g., rectangular shape in a top view). As for the individual regions of the outermost rows and columns in the two-dimensional array of the individual regions UR, it is not required that the grooves 60g surround the four sides of the light-emitting elements 20 in a top view.

The arrangement of the grooves 60g basically applies to the arrangement of the above-described protrusion 30w. The protrusion 30w can also be provided in the light source portion 100A so as to surround the light-emitting element 20 in each of the individual regions UR as do the grooves 60g. For example, the protrusion 30w as the partition DV can be provided in the form of a lattice-shaped wall in the upper surface 30a of the light reflecting member 30A.

Figure 14:
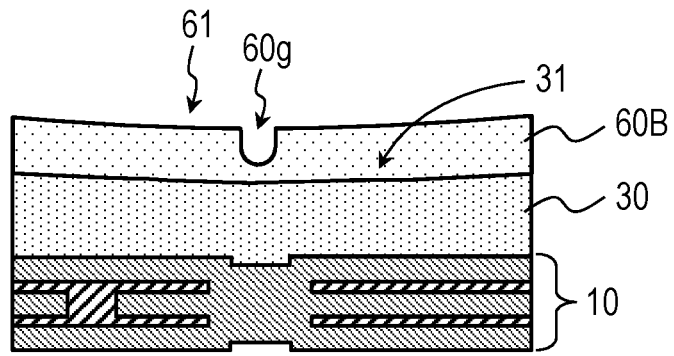
FIG. 14 is a schematic cross-sectional view showing an example of the cross-sectional shape of the groove 60g shown in FIG. 10 and FIG. 11.
Figure 15:
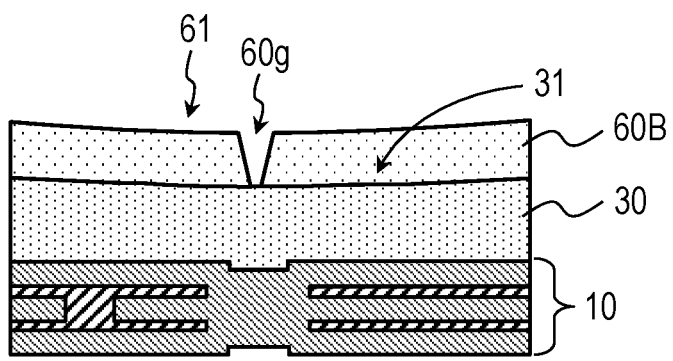
FIG. 15 is a schematic cross-sectional view showing another example of the cross-sectional shape of the groove 60g shown in FIG. 10 and FIG. 11.
Figure 16:
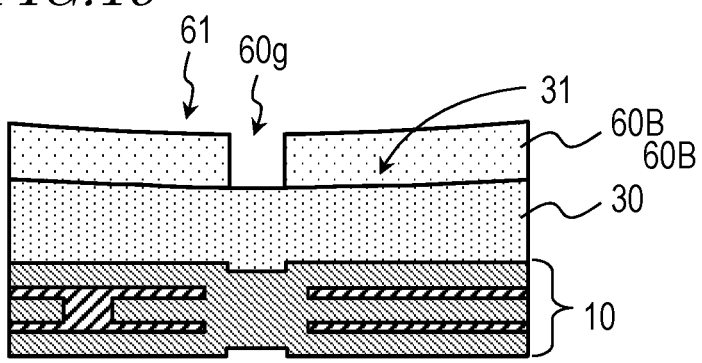
FIG. 16 is a schematic cross-sectional view showing still another example of the cross-sectional shape of the groove 60g shown in FIG. 10 and FIG. 11.

FIG. 14, FIG. 15 and FIG. 16 show examples of the cross-sectional shape of the groove 60g. The shape of the groove 60g is not limited to a V-groove such as shown in FIG. 10 and FIG. 11 but can be selected from various shapes. FIG. 14 is an example where the groove 60g in the shape of a U-groove is provided in the protecting layer 60B. The shape of one or more lateral surfaces which define the shape of the groove 60g is not limited to a planar shape but may be a shape which includes a curved surface. The shape of the lateral surfaces of the groove 60g as viewed in cross section is not limited to a linear shape or an arc shape, or a combination thereof, but can be a shape which includes step(s) or bend(s).

The depth of the groove 60g is, for example, in the range of not less than 20% and not more than 100% of the distance from the upper surface 60a of the protecting layer 60B to the upper surface 30a of the light reflecting member 30. From the viewpoint of improvement in contrast ratio between two adjoining individual regions UR, forming the groove 60g so as to reach the upper surface 30a of the light reflecting member 30 is advantageous. In this case, the cross-sectional shape of the groove 60g can be a trapezoidal shape as illustrated in FIG. 15. FIG. 16 is an example where the groove 60g is shaped such that the lateral surfaces are generally perpendicular to the upper surface 30a of the light reflecting member 30. In the case in which the depth of the groove 60g is enough to reach the upper surface 30a of the light reflecting member 30, the protecting layer 60B can include a plurality of portions which are spatially isolated in respective ones of the individual regions UR. It is not required that the width of the groove 60g gradually decreases from the upper surface 60a of the protecting layer 60B toward the upper surface 30a of the light reflecting member 30. Alternatively, such a shape can also be employed that the width of the opening of the groove 60g at the upper surface 60a of the protecting layer 60B is smaller than the width of a portion of the groove 60g which is present inner side of the protecting layer 60B.

Figure 17:
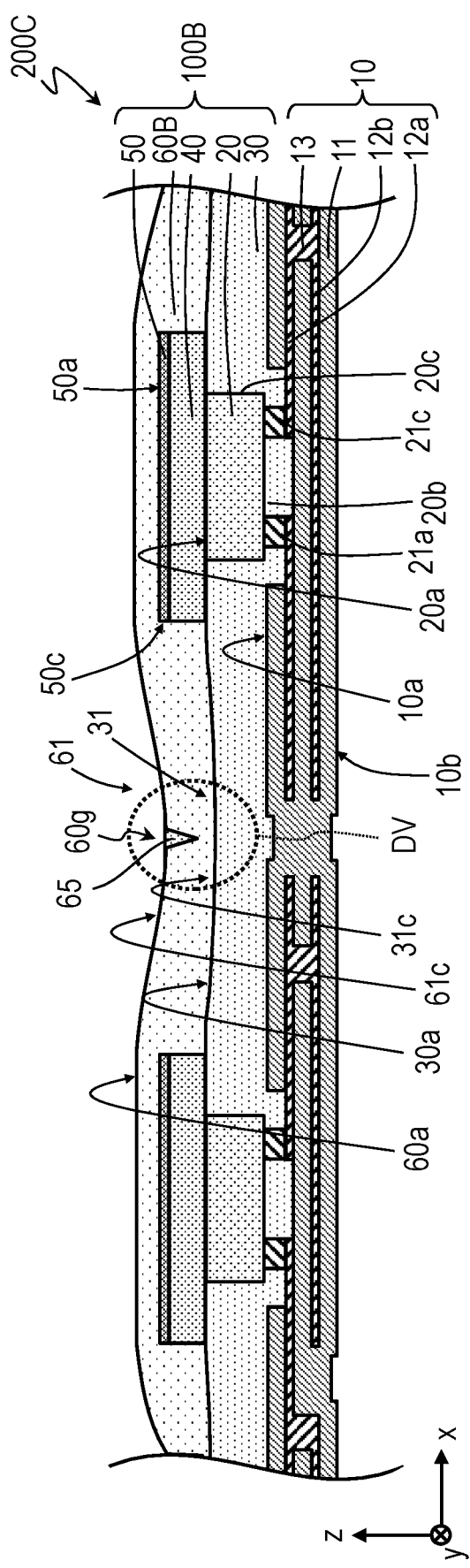
FIG. 17 is a cross-sectional view schematically showing an exemplary configuration of a light-emitting unit 200C of yet another embodiment of the present disclosure.
Figure 18:
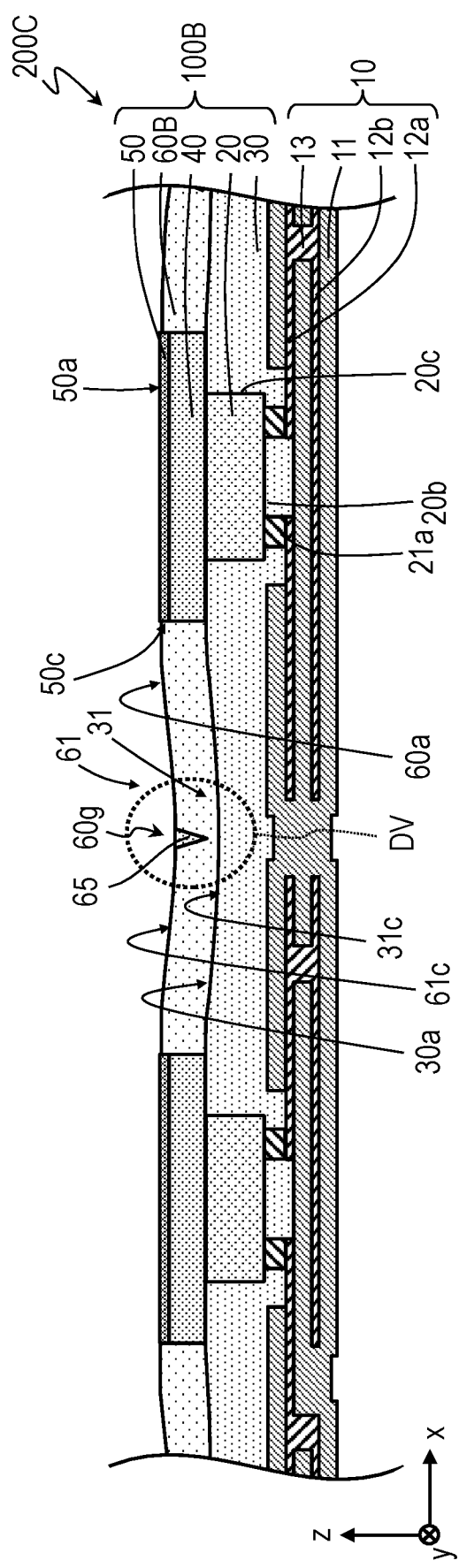
FIG. 18 is a cross-sectional view schematically showing another exemplary configuration of the light-emitting unit 200C shown in FIG. 17.

FIG. 17 is a cross-sectional view schematically showing an exemplary configuration of a light-emitting unit 200C of yet another embodiment of the present disclosure. FIG. 18 is a cross-sectional view schematically showing another exemplary configuration of the light-emitting unit 200C. Likewise, as in the example previously described with reference to FIG. 10, the light-emitting unit 200C shown in FIG. 17 includes a wiring board 10 and a light source portion 100B.

The partition DV of this example includes a partitioning member 65 which is present inside the grooves 60g, in addition to the grooves 60g. Likewise, the light-emitting unit 200C shown in FIG. 18 is different from the example shown in FIG. 11 in that the light-emitting unit 200C includes a partitioning member 65 which is present inside the grooves 60g.

The partitioning member 65 is, for example, formed of the same material as that of the light reflecting layer 50 or the light reflecting member 30, and is therefore capable of reflecting light. In the example shown in FIG. 17 and in the example shown in FIG. 18, the partitioning member 65 is provided inside the grooves 60g. Providing the partitioning member 65 inside the grooves 60g can improve the contrast ratio between two adjoining individual regions UR more advantageously. The partitioning member 65 can be provided for all of the grooves 60g or can be provided for some of the grooves 60g. The inside of the grooves 60g can be filled with the partitioning member 65 as in these examples, or can be filled with air.

Figure 19:
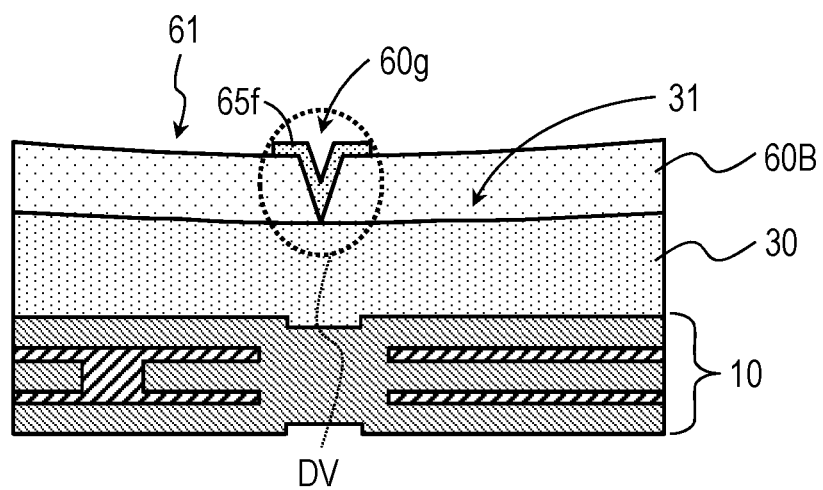
FIG. 19 is a schematic cross-sectional view showing another example of the shape of a partitioning member which can be provided inside the grooves 60g.

FIG. 19 shows another example of the shape of the partitioning member which can be provided inside the grooves 60g. In the example shown in FIG. 19, a partitioning member 65f in the form of a layer is provided in the partition DV so as to cover the lateral surfaces of the grooves 60g. As in this example, a partitioning member in the form of, for example, a resin layer can be provided inside the grooves 60g. The partitioning member 65f can be a reflective film, such as metal film, multilayer dielectric film, or the like.

Figure 20:
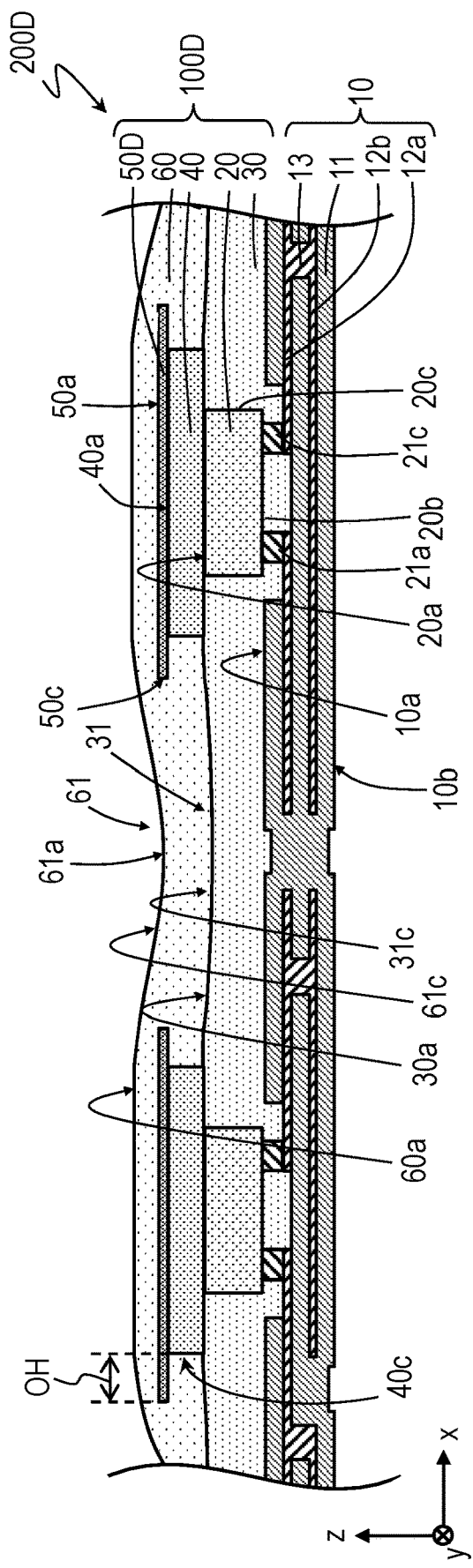
FIG. 20 is a cross-sectional view schematically showing an exemplary configuration of a light-emitting unit 200D of yet another embodiment of the present disclosure.
Figure 21:
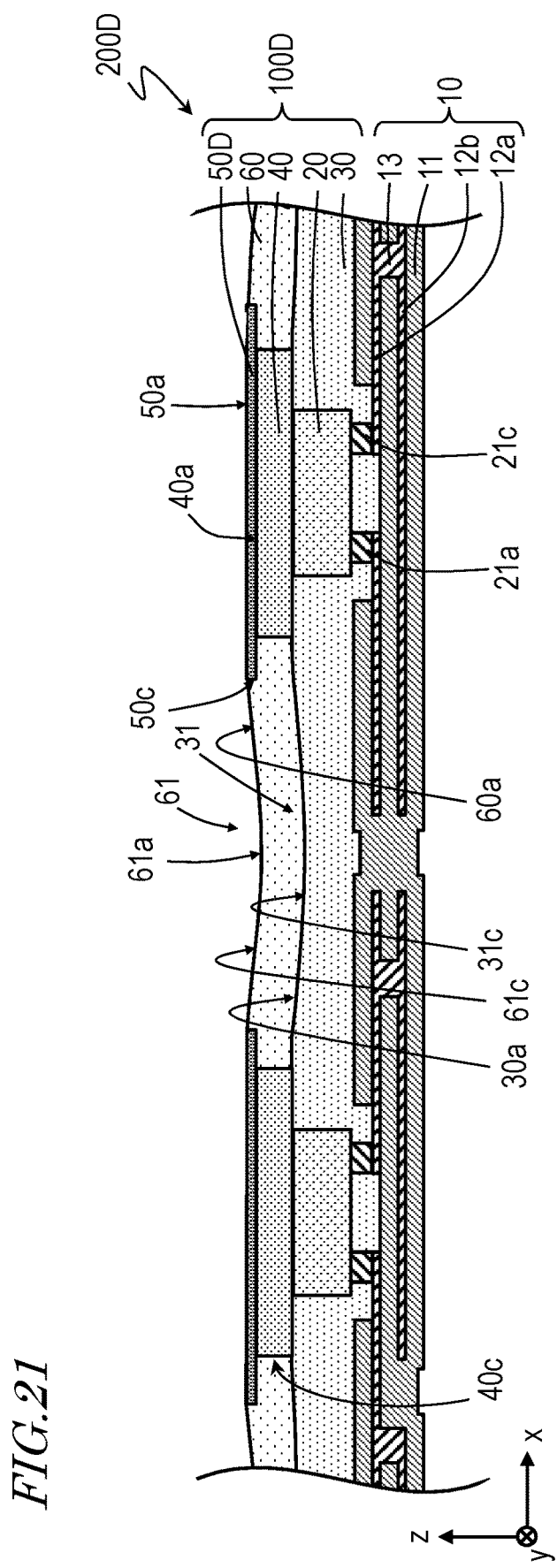
FIG. 21 is a cross-sectional view schematically showing another exemplary configuration of the light-emitting unit 200D shown in FIG. 20.

FIG. 20 is a cross-sectional view schematically showing an exemplary configuration of a light-emitting unit 200D of yet another embodiment of the present disclosure. FIG. 21 is a cross-sectional view schematically showing another exemplary configuration of the light-emitting unit 200D. The light-emitting unit 200D shown in FIG. 20 is different from the configuration previously described with reference to FIG. 1 in that the light-emitting unit 200D includes a light source portion 100D in place of the light source portion 100. The light source portion 100D includes light reflecting layers 50D in place of the light reflecting layers 50. Also in the example shown in FIG. 21, the light-emitting unit 200D includes a light source portion 100D which includes a plurality of light reflecting layers 50D in part thereof. In the configuration illustrated in FIG. 20, the upper surfaces 50a of the light reflecting layers 50D are covered with the protecting layer 60. In the configuration illustrated in FIG. 21, the upper surfaces 50a of the light reflecting layers 50D are exposed from the protecting layer 60.

In the configuration illustrated in FIG. 20 and the configuration illustrated in FIG. 21, the lateral surfaces 50c of the light reflecting layer 50D are not coplanar with the lateral surfaces 40c of the wavelength conversion layer 40, and part of the light reflecting layer 50D extends out beyond the upper surface 40a of the wavelength conversion layer 40 in the X direction. In other words, as seen in the z direction, the area of the upper surface 50a of the light reflecting layer 50D is greater than the area of the upper surface 40a of the wavelength conversion layer 40.

As previously described, a light reflecting layer provided on the wavelength conversion layer 40 (herein, the light reflecting layer 50D) is a semi-light-shielding layer which is capable of transmitting part of incoming light. Therefore, even if the light reflecting layer is provided on the wavelength conversion layer 40, a relatively large difference in luminance can still occur between a region of the upper surface 60a of the protecting layer 60 immediately above the wavelength conversion layer 40 and a surrounding region thereof. In the case in which the light reflecting layer 50D that has a larger area than the upper surface 40a of the wavelength conversion layer 40 in a top view is provided on the wavelength conversion layer 40, reflection is repeated between the light reflecting layer 50D and the light reflecting member 30, so that light guided from the wavelength conversion layer 40 into the protecting layer 60 can propagate to a position more distant from the light-emitting element 20. As a result of the light reaching a position more distant from the light-emitting element 20, as seen along the z direction, the difference in luminance between the region of the upper surface 60a of the protecting layer 60 immediately above the wavelength conversion layer 40 and the surrounding region thereof is moderated. That is, the effect of improving the unevenness in luminance is achieved, and the region immediately above the wavelength conversion layer 40 can be prevented from being perceived as a point light source. The distance from the lateral surfaces 40c of the wavelength conversion layer 40 to the lateral surfaces 50c of the light reflecting layer 50D in one individual region (represented by double-headed arrow OH in FIG. 20) is, for example, about 50 μm.

Figure 22:
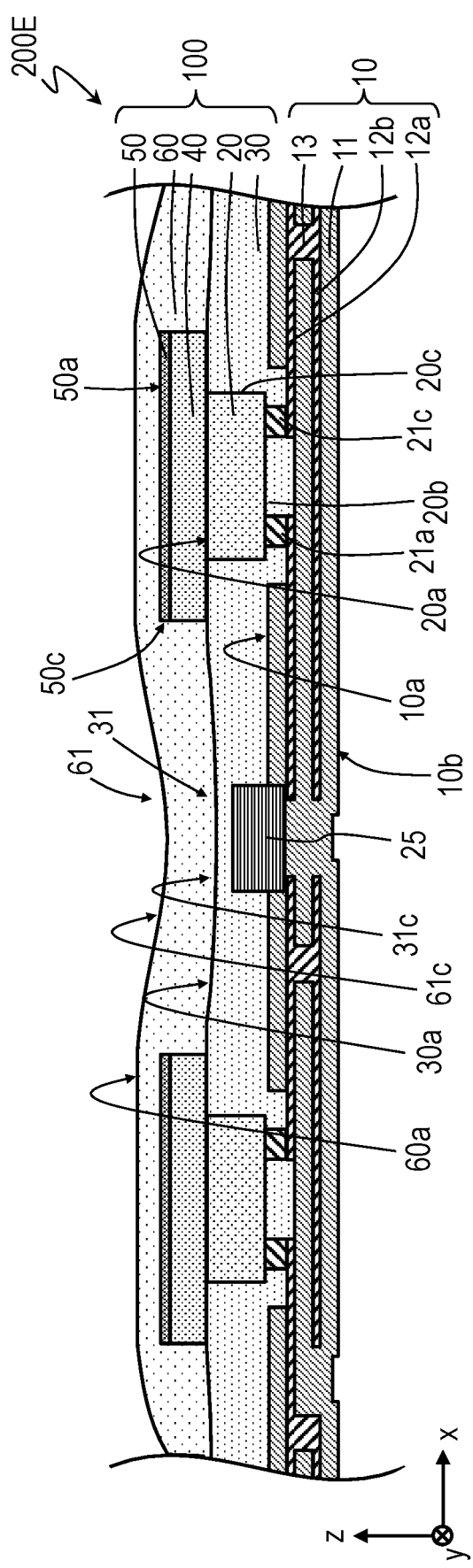
FIG. 22 is a cross-sectional view schematically showing an exemplary configuration of a light-emitting unit 200E of yet another embodiment of the present disclosure.
Figure 23:
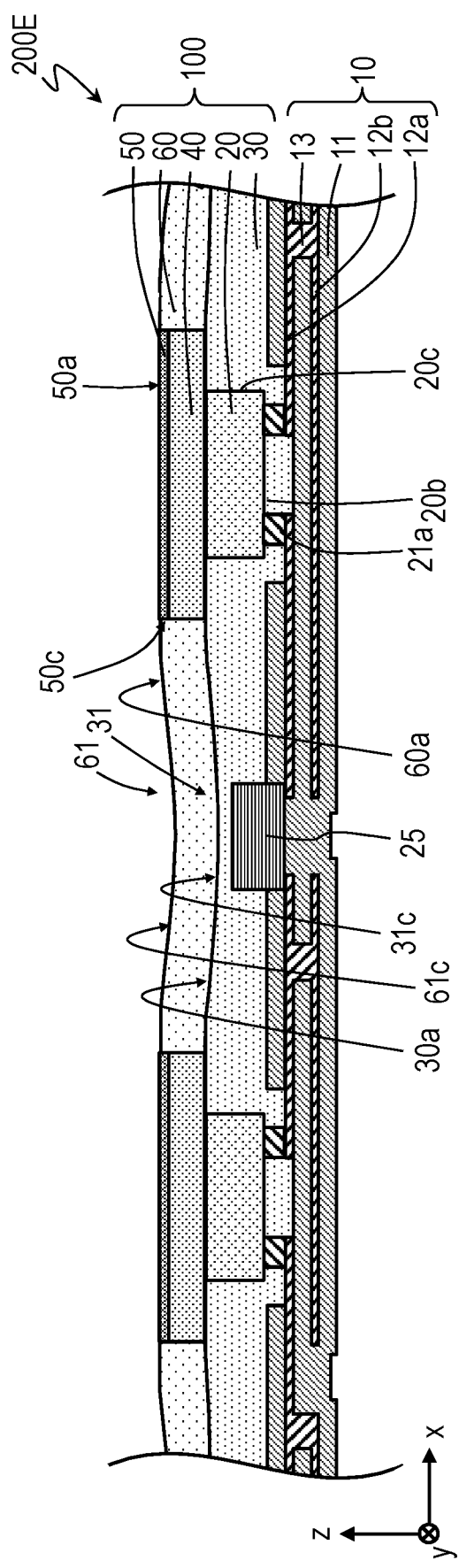
FIG. 23 is a cross-sectional view schematically showing another exemplary configuration of the light-emitting unit 200E shown in FIG. 22.

FIG. 22 is a cross-sectional view schematically showing an exemplary configuration of a light-emitting unit 200E of yet another embodiment of the present disclosure. FIG. 23 is a cross-sectional view schematically showing another exemplary configuration of the light-emitting unit 200E. The difference between the configuration illustrated in FIG. 22 and the configuration illustrated in FIG. 23 resides in that, the upper surfaces 50a of the light reflecting layers 50 are exposed from the protecting layer 60 in the example shown in FIG. 23.

The light-emitting unit 200E shown in FIG. 22 and FIG. 23 is different from the configuration previously described with reference to FIG. 1 in that the light-emitting unit 200E further includes a circuit element which is electrically connected with the conductor wire layer of the wiring board 10 and which is different from the light-emitting elements 20. In this example, a circuit element 25 is mounted to the wiring board 10 together with the light-emitting elements 20, and the entirety of the circuit element 25 is covered with the light reflecting member 30. In other words, the entirety of the circuit element 25 is embedded in the light reflecting member 30.

The circuit element 25 can be, for example, a driver connected with two or more light-emitting elements 20 or a protection element such as Zener diode or the like. In the case in which a protection element is provided as the circuit element 25 on the wiring board 10, the circuit element 25 can be electrically connected in series or parallel with the light-emitting element 20 of each of the individual regions UR. In other words, the circuit element 25 can be mounted to the wiring board 10 in every one of the individual regions UR which includes the light-emitting element 20.

Mounting not only the light-emitting elements 20 but also the circuit elements 25 to the wiring board 10 can simplify the structure of an external control circuit connected with the connector C. Embedding the circuit elements 25 mounted on the wiring board 10 into, for example, the light reflecting member 30 of the light source portion 100 can inhibit light emitted by the light-emitting elements 20 from being absorbed by the circuit elements 25, and can inhibit reduction in the utilization efficiency of light attributed to the circuit elements 25 mounted to the wiring board 10.

Figure 24:
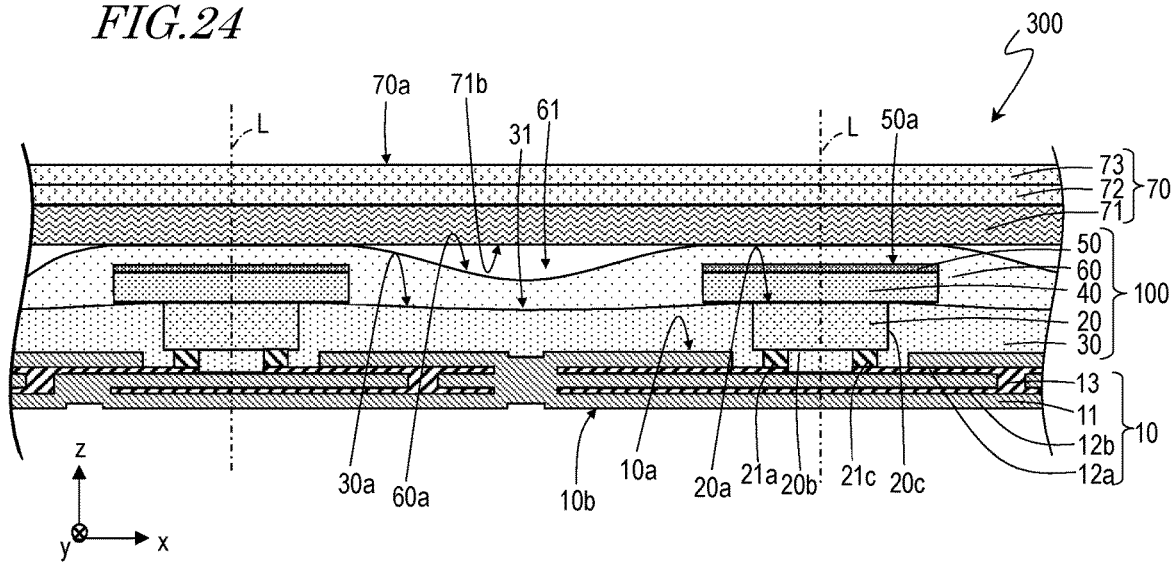
FIG. 24 is a cross-sectional view schematically showing an exemplary configuration of a surface-emission light source 300 of yet another embodiment of the present disclosure.
Figure 25:
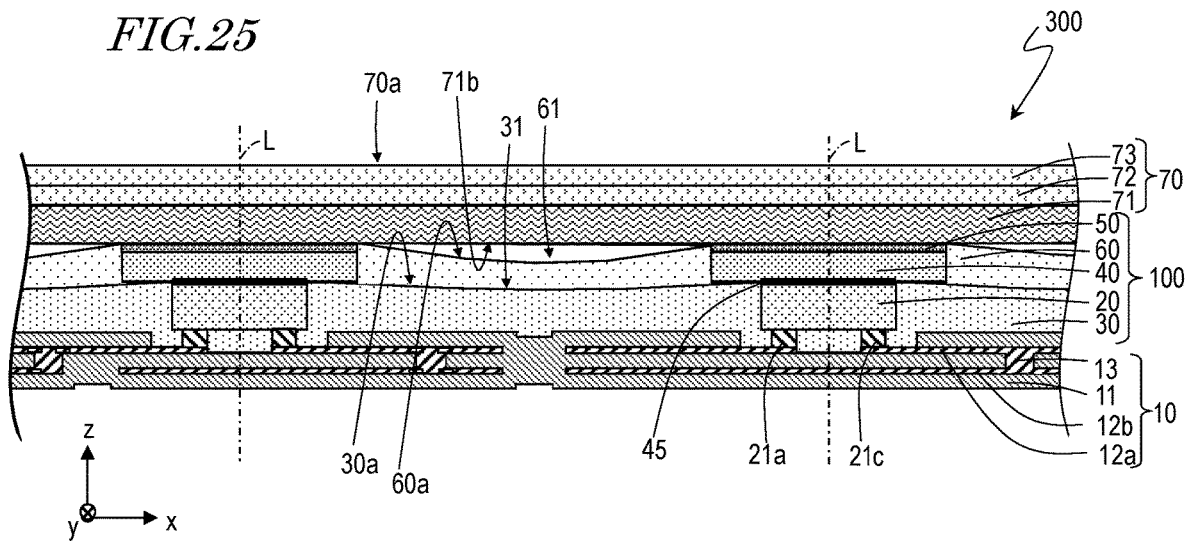
FIG. 25 is a cross-sectional view schematically showing another exemplary configuration of the surface-emission light source 300 shown in FIG. 24.

FIG. 24 is a cross-sectional view showing an exemplary configuration of a surface-emission light source 300 of yet another embodiment of the present disclosure. FIG. 25 is a cross-sectional view showing another exemplary configuration of the surface-emission light source 300. The surface-emission light source 300 includes any of the above-described light-emitting units 200, 200A, 200B, 200C, 200D and 200E and a light-transmitting multilayer structure 70. The light-transmitting multilayer structure 70 includes a diffuser and prism films 72 and 73. The shape of the light-transmitting multilayer structure 70 is, for example, a rectangular shape in a top view. FIG. 24 illustrates a cross-sectional structure of the surface-emission light source 300 that is realized by providing the light-transmitting multilayer structure 70 on or above the light-emitting unit 200 that has the cross-sectional structure shown in FIG. 1. FIG. 25 illustrates a cross-sectional structure of the surface-emission light source 300 that is realized by providing the light-transmitting multilayer structure 70 on or above the light-emitting unit 200 that has the cross-sectional structure shown in FIG. 2.

Diffuser 71

In the surface-emission light source 300, the diffuser 71 can be provided on or above the protecting layer 60. In other words, the diffuser 71 can be provided in the surface-emission light source 300 so as to be spaced away from the upper surface 60a of the protecting layer 60, or can be in direct contact with at least part of the upper surface 60a. The diffuser 71 diffuses and transmits incoming light. The structure for diffusing light is provided in the diffuser 71 by providing recesses and protrusions in the surface of the diffuser 71 or dispersing a material having a different refractive index in the diffuser 71. The diffuser 71 is formed of, for example, a material whose absorbance with respect to visible light is small, such as polycarbonate resins, polystyrene resins, acrylic resins, polyethylene resins, etc. As the diffuser 71, an optical sheet commercially available under the name of "light diffusion sheet", "diffuser film", etc., may be used. The thickness of the diffuser 71 can be, for example, about 0.443 mm.

In the configuration illustrated in FIG. 24 and the configuration illustrated in FIG. 25, the surface-emission light source 300 has a space between the recess 61 of the upper surface 60a of the protecting layer 60 and the lower surface 71b of the diffuser 71. This space is filled with, for example, air. In other words, in the present embodiment, the surface-emission light source 300 has an air layer between the concave surface 61c of the recess 61 of the upper surface 60a and the lower surface 71b of the diffuser 71. Due to the air layer provided between the protecting layer 60 and the diffuser 71, part of light entering from the wavelength conversion layer 40 into the protecting layer 60 which is incident on the concave surface 61c at a large incidence angle can be reflected toward the upper surface 30a of the light reflecting member 30. Repetition of reflection between the concave surface 61c and the upper surface 30a of the light reflecting member 30, reflection can improve the extraction efficiency of light extracted at a position distant from the light-emitting element 20.

Prism Films 72, 73

Each of the prism films 72, 73 provided above the diffuser 71 includes an array of a plurality of prisms each extending in a predetermined direction. For example, in FIG. and FIG. 25, the prism film 72 includes a plurality of prisms each extending in the y direction, and the prism film includes a plurality of prisms each extending in the x direction. In the present disclosure, a multilayer structure of the prism films 72, 73 is referred to as "prism sheet". The prism films 72, 73 refract light incoming from various directions in a direction toward a display panel (not shown) which is opposite to the light-emitting unit 200 (+z direction in the drawings). As a consequence, large part of the light outgoing from the upper surface 70a of the light-transmitting multilayer structure 70 which is the emission surface of the surface-emission light source 300 is perpendicular to the upper surface 70a (parallel to the z axis), so that the luminance of the surface-emission light source 300 as viewed from the front (z direction) can be improved. As the prism films 72, 73, a wide variety of commercially-available optical members for backlight can be used. The thicknesses of the prism films 72, 73 can be, for example, about 0.07 mm and about 0.09 mm, respectively.

The light-transmitting multilayer structure 70 can include a prism sheet which has a multilayer structure of two prism films. The thickness of the prism sheet can be about 0.08 mm. Thus, the thickness of the prism sheet can be reduced to about a half of the thickness achieved in the case in which two prism films are simply stacked up. As the prism sheet, for example, Advanced Structured Optical Composite (ASOC) manufactured by 3M can be used. Using such a prism sheet can further reduce the thickness of the surface-emission light source 300. Such a thin surface-emission light source 300 is useful in uses for smartphones and the like. The prism sheet can be in direct contact with the diffuser 71, or can be provided in the light-transmitting multilayer structure 70 so as to be spaced away from the diffuser 71.

The surface-emission light source 300 can further include a reflective polarizing layer (not shown) located above the prism film 73. The reflective polarizing layer selectively transmits light advancing in a polarization direction which is identical with the polarization direction of a polarization plate located on the backlight side of a display panel, for example, a liquid crystal display panel, and reflects polarized light perpendicularly advancing in that polarization direction toward the prism film 72, 73 side. Part of the polarized light returning from the reflective polarizing layer is again reflected by the prism films 72, 73 and the diffuser 71 with the polarization direction being changed, and converted to polarized light advancing in polarization direction identical with that of the polarization plate of the liquid crystal display panel. The resultant light again enters the reflective polarizing layer and goes out to the display panel. In this way, light outgoing from the light-emitting unit 200 has an equal polarization direction, and light whose polarization direction is effective in improving the luminance of the display panel can be realized with high efficiency.

In recent years, the specification regarding the thickness of the light-emitting unit required in the market of video game consoles, smartphones, etc., is less than 2.0 mm. A very strict specification, for example, not less than 1.5 mm and not more than 1.65 mm, is sometimes required. The light-emitting unit 200 of an embodiment of the present disclosure can meet such a requirement. Further, the light reflecting layer 50 provided immediately above the wavelength conversion layer 40 can appropriately inhibit the unevenness in luminance of the light emitted from the emission surface of the light-emitting unit 200.

Figure 26:
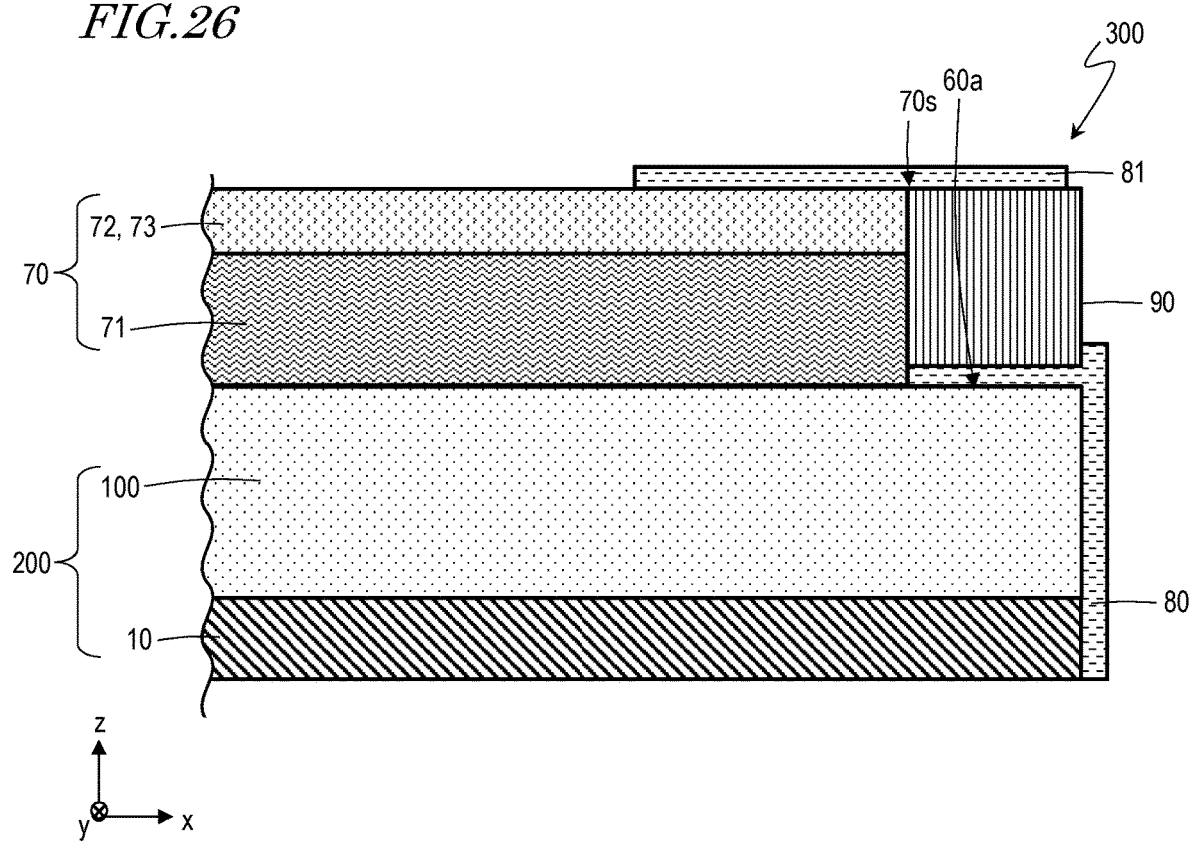
FIG. 26 is a cross-sectional view illustrating an edge portion of a light source portion 100 in the cross-sectional structure of the surface-emission light source 300 of the present embodiment.

FIG. 26 illustrates an edge portion of the light source portion 100 in the cross-sectional structure of the surface-emission light source 300 taken along line A-A' of FIG. 3. In the configuration illustrated in FIG. 26, the wiring board 10 and the light source portion 100 are fixed together by a tape 80 which covers the outer surfaces of these parts. Part of the tape 80 is in the form of a frame along the edges of the upper surface 60a of the protecting layer 60 of the light source portion 100. Part of the tape 80 overlying the upper surface 60a of the protecting layer 60 serves as an adhesive layer. By the adhesive layer, a rectangular frame 90 surrounding the outer surfaces of the light source portion 100 is fixed onto the light source portion 100. The light-transmitting multilayer structure 70, which includes the diffuser 71 and the prism films 72 and 73, is fixed onto the light source portion 100 by the frame 90. In this example, a frame-like tape 81 is provided on the upper surfaces of the frame 90 and the light-transmitting multilayer structure 70 along the border 70s between the frame 90 and the light-transmitting multilayer structure 70. As the tapes 80, 81, for example, a double-sided tape manufactured by Nitto Denko Corporation (model number: No. 5606BN) can be used.

According to such an assemblage, it is not necessary to secure a space for providing a frame at the outer edge of the FPC. Thus, the region in which the light source portion 100 is provided can be extended to the vicinity of the outer edge of the wiring board 10. As described herein, the light source portion 100 can be provided on the FPC by using the region over the FPC to a great extent without changing the size of the FPC as the wiring board 10.

2. Manufacturing Method of Light-Emitting Unit 200

Figure 27:
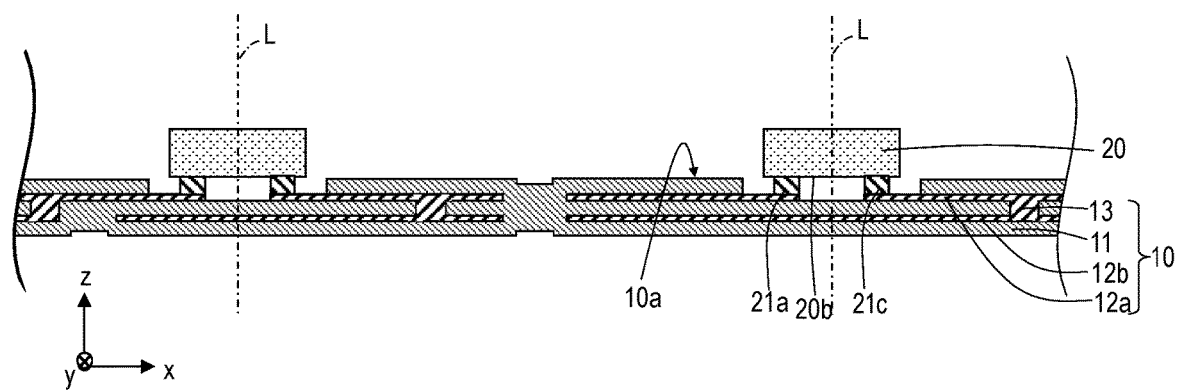
FIG. 27 is a stepwise cross-sectional view for illustrating each production step included in an exemplary manufacturing method of the light-emitting unit 200.
Figure 28:
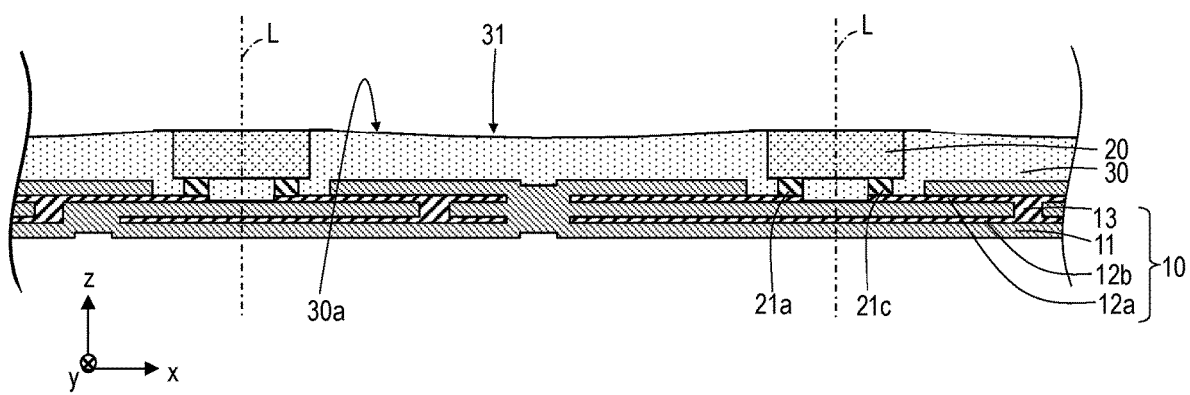
FIG. 28 is a stepwise cross-sectional view for illustrating each production step included in an exemplary manufacturing method of the light-emitting unit 200.
Figure 29:
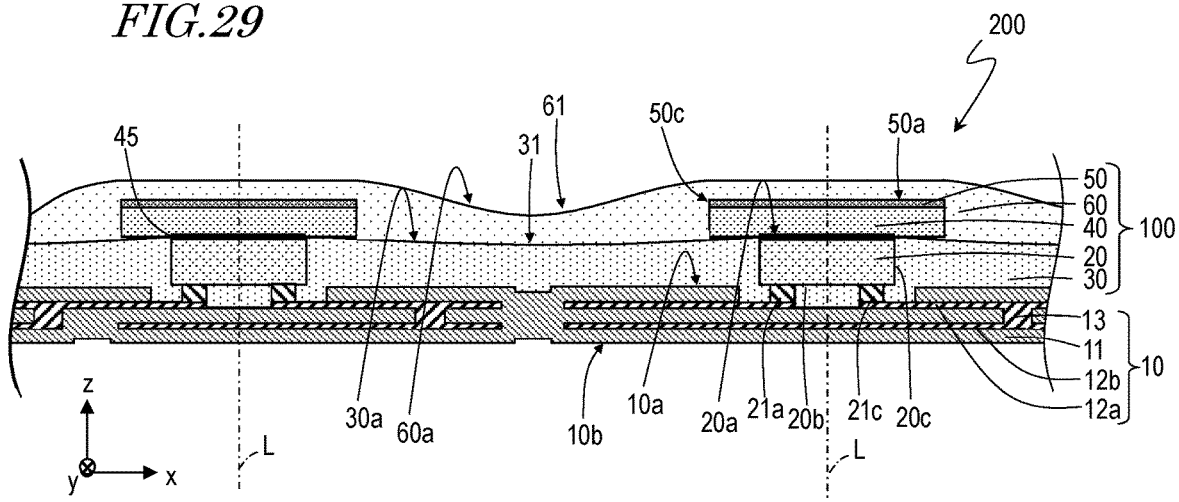
FIG. 29 is a stepwise cross-sectional view for illustrating each production step included in an exemplary manufacturing method of the light-emitting unit 200.
Figure 30:
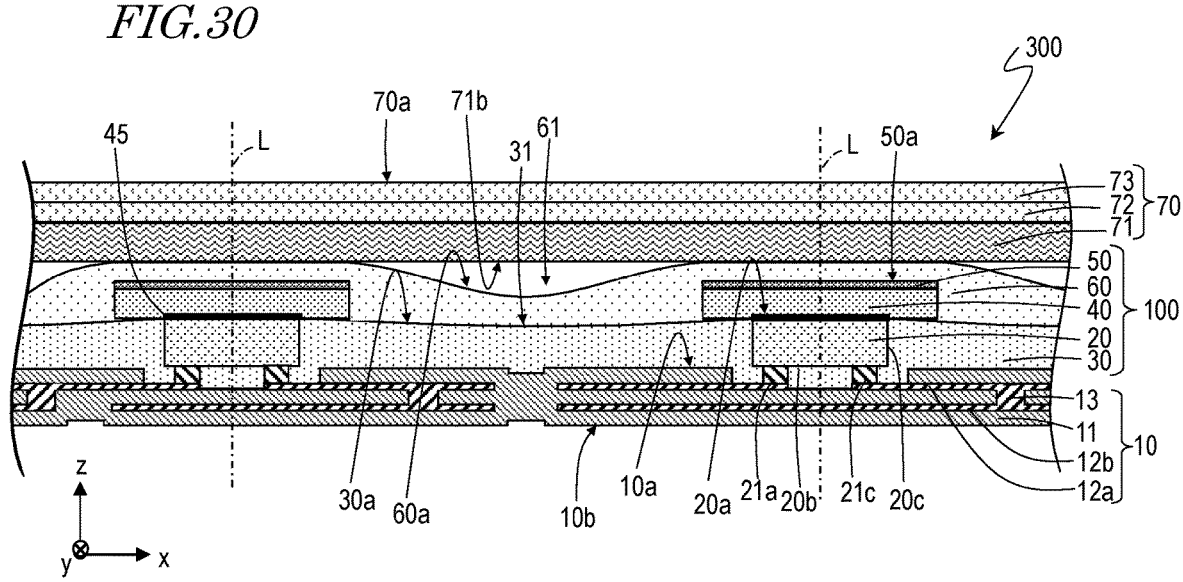
FIG. 30 is a stepwise cross-sectional view for illustrating each production step included in an exemplary manufacturing method of the surface-emission light source 300.

An example of the manufacturing method of the light-emitting unit 200 and an example of the manufacturing method of the surface-emission light source 300 are described with reference to FIG. 26, FIG. 27, FIG. 28, FIG. 29 and FIG. 30. FIG. 27, FIG. 28 and FIG. 29 show stepwise cross-sectional views for illustrating respective production steps included in the manufacturing method of the light-emitting unit 200. FIG. 30 shows a stepwise cross-sectional view for illustrating a production step included in the manufacturing method of the surface-emission light source 300.

For example, an FPC as the wiring board 10 and a plurality of light-emitting elements 20 are provided. Then, as shown in FIG. 27, the light-emitting elements 20 are mounted to the wiring board 10. From the viewpoint of improving the bonding strength of the light-emitting elements 20 to the wiring board 10, an under fill can be supplied in the space between the lower surface 20b of the light-emitting elements 20 and the upper surface 10a of the wiring board 10.

Then, the wiring board 10 with the light-emitting elements 20 mounted thereto is placed in a mold and a photocurable resin material is supplied into the mold by, for example, potting. The resin material applied onto the wiring board 10 is irradiated with ultraviolet light and cured, whereby a light reflecting member 30 is formed so as to cover the lateral surfaces of each of the plurality of light-emitting elements 20 as shown in FIG. 28. In this step, for example, a recess 31 can be formed in the surface of the resin material in the form of a sink mark resulting from curing of the resin material.

At any timing before the wavelength conversion layer 40 and the light reflecting layer 50 are formed immediately above the light-emitting elements 20, a plurality of sheet pieces of a multilayer structure, each of which includes a light reflecting layer on a wavelength conversion layer, are provided. For example, a sheet-like multilayer structure is provided in which a light reflecting layer is provided on a wavelength conversion layer. For example, such a multilayer structure can be formed as follows. First, a resin material with phosphor particles dispersed therein is injected into a mold and cured, whereby a sheet-like wavelength conversion layer is formed. Then, a resin material for the light reflecting layer is applied onto the wavelength conversion layer and cured, whereby a sheet-like multilayer structure is completed. The multilayer structure is divided into, for example, square pieces of 0.8 mm on each side, whereby the plurality of sheet pieces which have been described above can be realized.

After the light reflecting member 30 is formed, for example, an adhesive is applied to the emission surface 20a of each of the plurality of light-emitting elements 20, and a sheet piece is attached to the emission surface 20a as shown in FIG. 29. Placement of the sheet piece on the emission surface 20a with the adhesive applied thereto can be performed using, for example, a die bonder. In this step, the die bonder carries out alignment such that the center of the sheet piece is located on the optical axis L. From the viewpoint of covering the entirety of the emission surface 20a of the light-emitting element 20 with the sheet piece, it is preferred that the area of the sheet piece is larger than the area of the emission surface 20a. This can relax the requirement on the alignment accuracy. In this way, the plurality of wavelength conversion layers 40 and the plurality of light reflecting layers 50 can be formed immediately above the plurality of light-emitting elements 20. As shown in the drawing, the light source portion 100 can include an adhesive layer 45 between the upper surface 20a of the light-emitting element 20 and the wavelength conversion layer 40.

Then, a structure in which the wavelength conversion layer 40 and the light reflecting layer 50 are provided above the emission surface 20a of each of the light-emitting elements 20 is placed in a mold, and a transparent resin material is applied to the light reflecting member 30 by potting or the like. In this step, the transparent resin material can be applied to the light reflecting member 30 so as to cover the upper surface 50a of the light reflecting layer 50. Thereafter, the resin material is cured by ultraviolet irradiation, heating, or the like, whereby a protecting layer 60 can be formed so as to cover at least lateral surfaces of the plurality of wavelength conversion layers 40 and at least lateral surfaces of the plurality of light reflecting layers 50. In this step, for example, a sink mark is formed in the surface of the cured resin material, whereby a recess 61 is formed in the protecting layer 60. Through the above-described process, a light-emitting unit 200 is formed which has the same or a similar configuration as that shown in FIG. 1. Part of the cured resin material can be removed by grinding, or the like, such that the upper surface 50a of the light reflecting layer 50 is exposed from the cured resin material. Alternatively, in the step of applying the transparent resin material to the light reflecting member 30, the transparent resin material can be applied to a region exclusive of the upper surfaces 50a of the light reflecting layers 50, and the transparent resin material is cured, whereby the protecting layer 60 is formed. By such a step, a light-emitting unit 200 is formed which has the same or a similar configuration as that shown in FIG. 2.

Before the light reflecting member 30 is formed, a circuit element 25 can be mounted to the wiring board 10 to obtain the light-emitting unit 200E illustrated in FIG. 22 and FIG. 23. After the material of the light reflecting member 30 is cured, the material of the light reflecting member 30 is further applied, for example, in the form of lines to the surface of the cured material using a dispenser or the like and cured, whereby the protrusion 30w illustrated in, e.g., FIG. 6 can be formed. The grooves 60g as the partition DV which has previously been described with reference to FIG. 10 can be formed, after formation of the protecting layer 60, by removing part of the protecting layer 60 by laser irradiation or by cutting with the use of a grindstone. After the grooves 60g are formed, for example, the material of the light reflecting member 30 can be provided in the grooves 60g, and the material of the light reflecting member 30 is cured, whereby a light-emitting unit 200C can be obtained which includes the partitioning member 65 such as shown in FIG. 17 and FIG. 18. By applying the material of the light reflecting member 30 to the surfaces of the grooves 60g by printing or the like, the partitioning member 65f such as shown in FIG. 19 can be formed.

Instead of attaching a sheet piece of the multilayer structure which includes the light reflecting layer on the wavelength conversion layer to the emission surface 20a of each of the plurality of light-emitting elements 20, a phosphor sheet piece which is formed of a resin in which phosphor particles are dispersed can be attached to each emission surface 20a. After the transparent resin material is applied to the light reflecting member 30 and cured, the surface of the phosphor sheet piece is exposed by grinding or the like. By applying the resin material of the light reflecting layer to the surface of the phosphor sheet piece and curing the applied resin material, or by attaching a resin sheet piece, which is formed of the resin material of the light reflecting layer, to the surface of the phosphor sheet piece, the light reflecting layer 50D which is shaped so as to extend out beyond the upper surface 40a of the wavelength conversion layer 40, such as shown in FIG. 20 and FIG. 21, can be formed.

When necessary, an optical member such as a diffuser is provided above the protecting layer 60. For example, the outer edges of the wiring board 10 and the light-emitting unit 200 is covered with the tape 80 as shown in FIG. 26. In this case, along the rim of the protecting layer 60 of the light-emitting unit 200, part of the tape 80 is provided on the upper surface 60a of the protecting layer 60. Thereby, a frame-like adhesive layer can be formed on the upper surface 60a of the protecting layer 60. Then, the frame 90 is fixed onto the light-emitting unit 200 by an adhesive layer.

Then, as shown in FIG. 26 and FIG. 30, the light-transmitting multilayer structure 70 is placed on or above the protecting layer 60 of the light-emitting unit 200, and the light-transmitting multilayer structure 70 is fixed to the light-emitting unit 200 by the frame 90. In this step, an air layer can exist between the recess 61 of the protecting layer and the lower surface 71b of the diffuser 71. In the light-transmitting multilayer structure 70, for example, a prism film manufactured by 3M (model number: BEF4 DML) can be used as the prism film 72, and a prism film manufactured by 3M (model number: TBEF2-DT-LS) can be used as the prism film 73. Thereafter, a frame-like tape 81 is attached along the border 70s between the frame 90 and the light-transmitting multilayer structure 70 at the upper surface side of the light-transmitting multilayer structure 70. Instead of fixing with the use of the frame 90, the light-transmitting multilayer structure 70 can be fixed onto the protecting layer 60 by laser welding. Through the foregoing process, the surface-emission light source 300 is manufactured.

Figure 31:
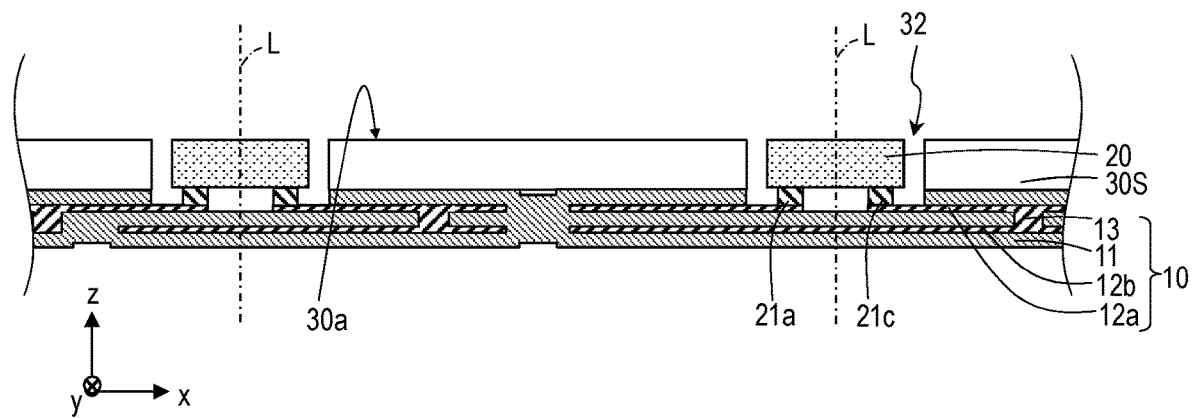
FIG. 31 is a stepwise cross-sectional view for illustrating each production step included in a variation of the manufacturing method of the light-emitting unit.

A light source portion which includes a light reflecting member can be provided by placing a resin sheet or the like on the wiring board 10, instead of forming the light reflecting member 30 by curing a resin material applied onto the wiring board 10. For example, after light-emitting elements 20 are mounted to the wiring board 10, as shown in FIG. 31, a resin sheet which has through holes 32 at positions corresponding to the plurality of light-emitting elements 20 on the wiring board 10 can be placed on the wiring board 10 using an adhesive sheet or the like. Thereby, a light reflecting member 30S which has the through holes 32 at positions corresponding to the plurality of light-emitting elements 20 can be formed on the wiring board 10.

The light reflecting member 30S can be realized by a light reflective resin sheet whose base material is polyethylene terephthalate (PET) or the like. The method for forming the plurality of through holes 32 is not particularly limited. For example, the light reflecting member 30S having the through holes 32 at desired positions can be produced by forming the through holes in the resin sheet by punching. In the case in which a circuit element 25 is provided on the wiring board 10 as in the example shown in FIG. 22 and FIG. 23, an additional through hole 32 can be formed at a position corresponding to the circuit element 25.

In the case in which a resin sheet is used for formation of the light reflecting member 30S, the upper surface 30a of the light reflecting member 30S is basically a flat surface. In other words, the upper surface 30a of the light reflecting member 30S basically does not have a recessed portion. However, a protrusion 30w can be formed, on the upper surface 30a side of the light reflecting member 30S, in such a shape that surrounds the light-emitting elements 20 in a top view by linearly applying a resin material onto a resin sheet and curing the resin material, or by bonding a resin member which has a linear or grid shape onto a resin sheet.

Figure 32:
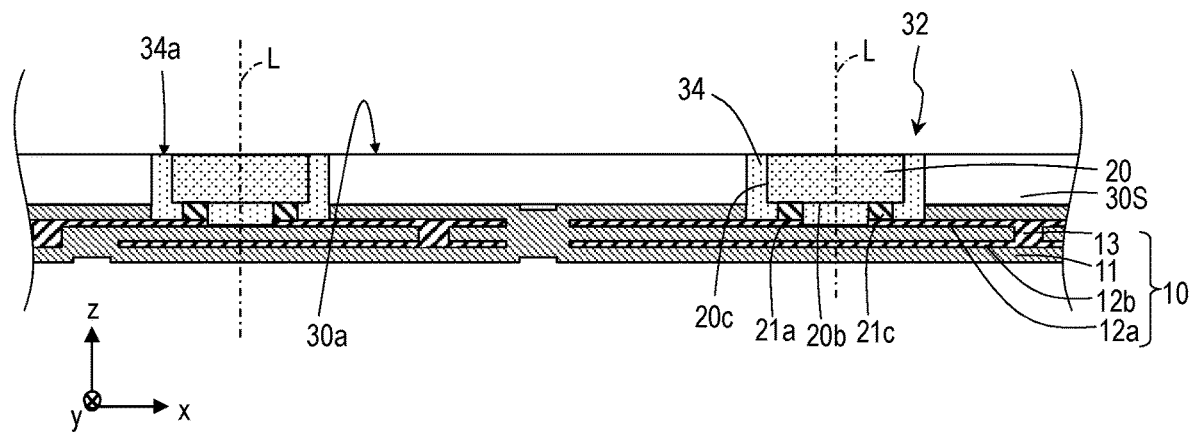
FIG. 32 is a stepwise cross-sectional view for illustrating each production step included in a variation of the manufacturing method of the light-emitting unit.

After the light reflecting member 30S is formed, when necessary, a resin material is supplied in each of the through holes 32 as shown in FIG. 32. The resin material provided inside the through holes 32 can be a transparent resin material, or can be a light reflective resin material which is the same as or similar to the material of the light reflecting layers 50. Thereafter, by curing the resin material in the through holes 32, an encapsulant 34 can be formed inside the through holes 32. The upper surface 34a of the encapsulant 34 is generally coplanar with the upper surface 30a of the light reflecting member 30S. Part of the encapsulant 34 (as underfill) can be present in a gap between the lower surface 20b of the light-emitting element 20 and the upper surface 10a of the wiring board 10. The entirety of the light reflecting member that covers the lateral surfaces of each of the light-emitting elements 20 on the wiring board 10 can be configured as the resin sheet and the resin material provided in the through hole 32 of the resin sheet. Alternatively, in forming the light reflecting member that covers the lateral surfaces of each of the light-emitting elements 20, part of the above-described light reflecting member 30 or light reflecting member 30A can be replaced by the resin sheet and the resin material provided in the through hole 32 of the resin sheet.

Figure 33:
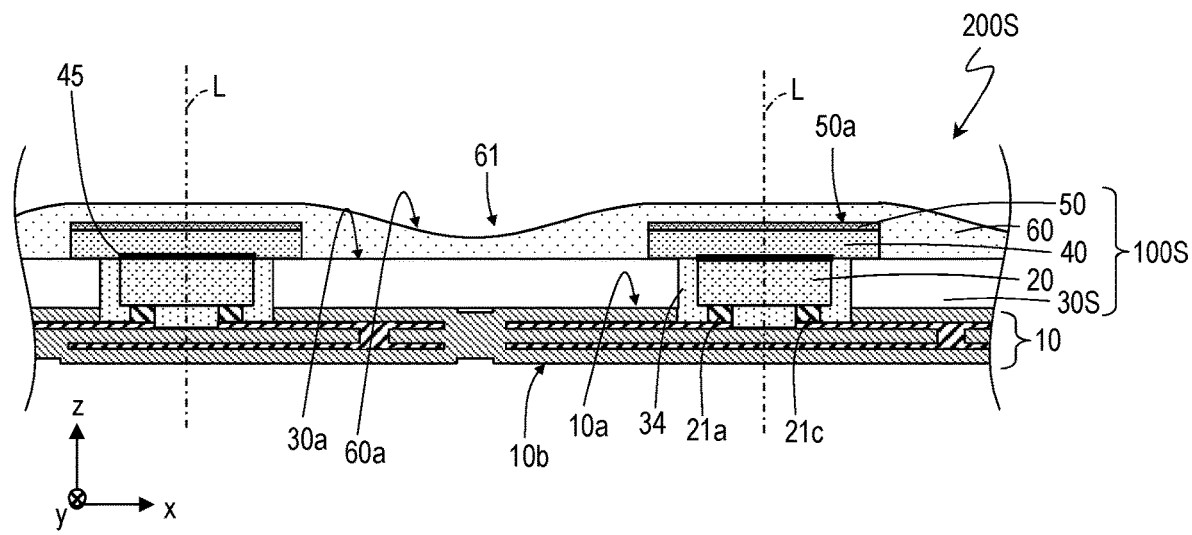
FIG. 33 is a stepwise cross-sectional view for illustrating each production step included in a variation of the manufacturing method of the light-emitting unit.

After the encapsulant 34 is formed, a wavelength conversion layer 40 and a light reflecting layer 50 are provided above each of the light-emitting elements 20. In this step, the wavelength conversion layer 40 can be formed above the emission surface 20a of the light-emitting element 20 so as to cover the encapsulant 34. Further, in the same way as the example previously described with reference to FIG. 29, a protecting layer 60 is formed so as to cover the light reflecting member 30S and the encapsulant 34 (see FIG. 33). The protecting layer 60 can cover the upper surface 50a of the light reflecting layer 50, or may not cover the upper surface 50a of the light reflecting layer 50. By formation of the protecting layer 60, a light source portion 100S in which the light reflecting member 30S is included in part can be produced on the wiring board 10. Through the foregoing steps, a light-emitting unit 200S can be manufactured which includes the light source portion 100S and the wiring board 10.

Figure 34:
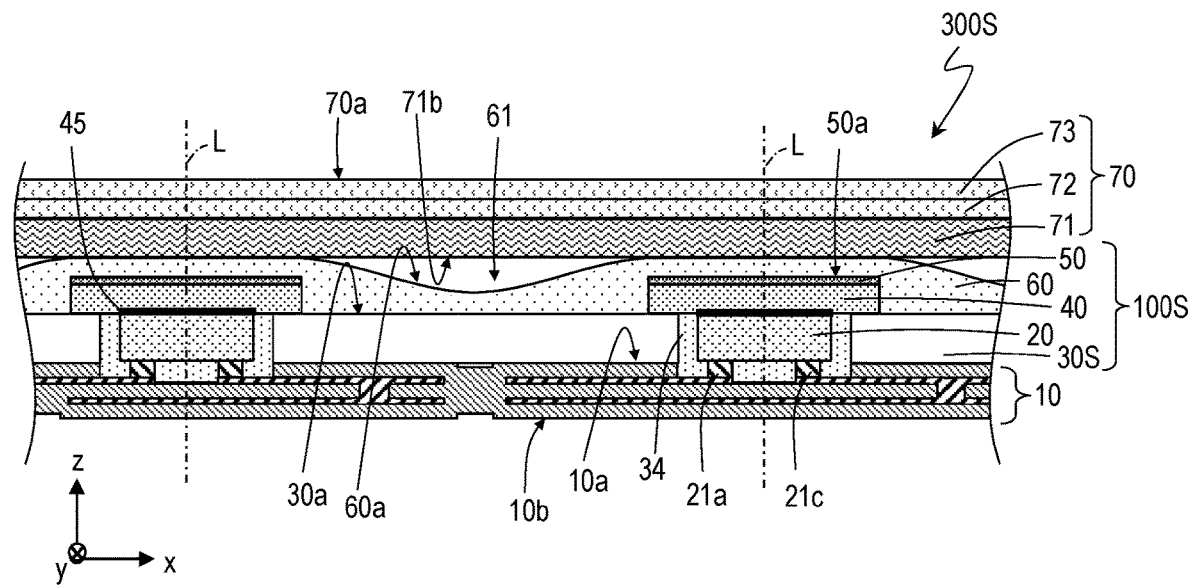
FIG. 34 is a stepwise cross-sectional view for illustrating an exemplary production step of a surface-emission light source 300S which includes a light-emitting unit 200S manufactured through the production steps shown in FIG. 31 through FIG. 33.

As illustrated in FIG. 34, a light-transmitting multilayer structure 70 can be provided on the protecting layer 60 of the above-described light-emitting unit 200S. For example, by fixing the light-transmitting multilayer structure to the light-emitting unit 200S using a frame 90, a surface-emission light source 300S in which the light source portion 100S is included in part is manufactured.

A light-emitting unit of an embodiment of the present disclosure can be manufactured and sold as a part of the surface-emission light source 300, 300S. For example, a manufacturer who purchases the light-emitting unit (e.g., the light-emitting unit 200) from a supplier can manufacture and sell a surface-emission light source which includes a light-emitting unit configured by assembling a light-emitting unit of an embodiment of the present disclosure and the other constituents, including the light-transmitting multilayer structure 70, according to the above-described method. Such a surface-emission light source can be suitably used as, for example, a backlight light source of a liquid crystal display device.

A light-emitting unit and a surface-emission light source of the present disclosure are applicable to a backlight light source of a liquid crystal display and various lighting devices.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

The invention claimed is:
1. A light-emitting unit comprising:
a wiring board;
a plurality of light-emitting elements provided on the wiring board and electrically connected with a wire layer of the wiring board;
a light reflecting member provided on the wiring board, the light reflecting member being in contact with an entirety of lateral surfaces of each of the plurality of light-emitting elements;
a wavelength conversion layer provided on or above an emission surface of each of the plurality of light-emitting elements, the emission surface facing away from the wiring board such that a surface of the wiring board, on which the light-emitting elements are provided, faces the same direction as the emission surface of each of the light-emitting elements;
a plurality of light reflecting layers respectively provided on the plurality of wavelength conversion layers; and
a protecting layer configured to transmit light and provided on the light reflecting member, the protecting layer being in contact with at least a lateral surface of the plurality of wavelength conversion layers and at least a lateral surface of the plurality of light reflecting layers, wherein
an upper surface of the protecting layer has a first recess in a region where the plurality of light reflecting layers are not present in a top view, and
the first recess includes at least one concave surface wherein a plurality of grooves are provided in the protecting layer, each of the plurality of grooves being located between two adjoining light-emitting elements in an array of the light-emitting elements in a top view.

2. The light-emitting unit of claim 1, wherein the protecting layer covers an upper surface of the plurality of light reflecting layers.

3. The light-emitting unit of claim 1, wherein
the plurality of wavelength conversion layers overlap the plurality of light reflecting layers in a top view, and at least a portion of each of the wavelength conversion layers or at least a portion of each of the light reflecting layers includes the emission surface of a corresponding one of the plurality of light-emitting elements, in a top view.

4. The light-emitting unit of claim 1, further comprising a plurality of adhesive layers between a plurality of emission surfaces of the plurality of light-emitting elements and the plurality of wavelength conversion layers, respectively.

5. The light-emitting unit of claim 1, wherein
each of the plurality of light reflecting layers has a dotted reflection pattern in a top view, and
in each of the plurality of light reflecting layers, a dot density of the reflection pattern increases from a periphery to a center of the light reflecting layer.

6. The light-emitting unit of claim 1, wherein the wiring board is a flexible printed circuit.

7. The light-emitting unit of claim 1, wherein at least one of the protecting layer and the light reflecting member has a greater coefficient of thermal expansion than a coefficient of the wiring board.

8. The light-emitting unit of claim 1, wherein the first recess has a plurality of continuously-formed concave surfaces.

9. The light-emitting unit of claim 1, wherein a thickness of the plurality of wavelength conversion layers is not less than 100 μm and not more than 200 μm.

10. The light-emitting unit of claim 1, wherein a thickness of the plurality of light reflecting layers is not less than 50 μm and not more than 100 μm.

11. The light-emitting unit of claim 1, wherein the one or plurality of grooves include multiple subsets of grooves, each of the subsets comprising one or more grooves that surrounds a corresponding one of the plurality of light-emitting elements in a top view.

12. The light-emitting unit of claim 1, wherein the light-emitting unit further comprises at least one light reflective partitioning member in the plurality of grooves.

13. The light-emitting unit of claim 12, wherein the partitioning member is provided in each of the plurality of grooves.

14. The light-emitting unit of claim 1, wherein
the light reflecting member has an upper surface that is opposite to the protecting layer, and
the upper surface of the light reflecting member has a second recess in a region where a plurality of upper surfaces of the plurality of light-emitting elements are not present, and
the second recess has a plurality of continuously-formed concave surfaces.

15. The light-emitting unit of claim 1, wherein the protecting layer contains a light diffusing material.

16. A surface-emission light source comprising:
the light-emitting unit according to claim 1;
a diffuser provided on or above the protecting layer; and
a prism sheet provided on or above the diffuser.

17. The surface-emission light source of claim 16, further comprising an air layer between the at least one concave surface of the first recess of the protecting layer and the diffuser.

18. The light-emitting unit of claim 1, wherein the light reflecting member is provided on the wire board in such manner that no portion of the upper surface of the light reflecting member reaches higher than the emission surfaces of the plurality of light-emitting elements.

19. The light-emitting unit of claim 1, wherein the light reflecting member is contacted by a portion of a bottom surface of the wavelength conversion layer corresponding to each of the plurality of light emitting elements.

\* \* \* \* \*